US012660340B2

(12) United States Patent     (10) Patent No.: US 12,660,340 B2
Jeong et al.     (45) Date of Patent: Jun. 16, 2026

(54) IMAGE SENSOR

(71) Applicant: SAMSUNG ELECTRONICS CO., LTD., Suwon-si (KR)

(72) Inventors: Haewook Jeong, Suwon-si (KR); Wonseok Lee, Suwon-si (KR); Minchul Lee, Suwon-si (KR); Masamichi Ito, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 609 days.

(21) Appl. No.: 18/117,201

(22) Filed: Mar. 3, 2023

(65) Prior Publication Data

US 2023/0282674 A1     Sep. 7, 2023

(30) Foreign Application Priority Data

Mar. 4, 2022    (KR) ........................ 10-2022-0028272
Oct. 6, 2022    (KR) ........................ 10-2022-0127722

(51) Int. Cl.
   *H01L 27/146*     (2006.01)
   *H10F 39/00*      (2025.01)
   *H10F 39/12*      (2025.01)
   *H10F 39/18*      (2025.01)

(52) U.S. Cl.
   CPC ........... *H10F 39/18* (2025.01); *H10F 39/199* (2025.01); *H10F 39/80373* (2025.01)

(58) Field of Classification Search
   CPC .. H10F 39/18; H10F 39/199; H10F 39/80373; H10F 39/802; H10F 39/807
   See application file for complete search history.

(56) References Cited

U.S. PATENT DOCUMENTS 9,728,565 B2   8/2017   Possum et al.
10,319,776 B2   6/2019   Ma et al.
10,367,029 B2 *   7/2019   Lee ........................ H10F 77/953
(Continued)

FOREIGN PATENT DOCUMENTS

JP       2012164971 A   *   8/2012   ........... H10F 39/014
KR   10-2012-0090352 A    8/2012
(Continued)

OTHER PUBLICATIONS

Jiaju Ma et al., "A Pump-Gate Jot Device With High Conversion Gain for a Quanta Image Sensor", Journal of the Electron Devices Society, 2015, pp. 73-77.

(Continued)

*Primary Examiner* — Jarrett J Stark
(74) *Attorney, Agent, or Firm* — Sughrue Mion, PLLC

(57)        ABSTRACT

An image sensor is provided. The image sensor includes: a semiconductor substrate including a first surface and a second surface, which are opposite to each other; a photoelectric conversion region in the semiconductor substrate; a vertical transfer gate, which extends into the semiconductor substrate from the first surface toward the photoelectric conversion region; a floating diffusion region, which is provided in the semiconductor substrate, is spaced apart from the vertical transfer gate, and is an n-type impurity region; and a second impurity region, which is provided between the vertical transfer gate and the floating diffusion region and is a p-type impurity region.

8 Claims, 17 Drawing Sheets

(56) References Cited

U.S. PATENT DOCUMENTS

| | | | | |
|---|---|---|---|---|
| 2005/0167704 A1* | 8/2005 | Ezaki | | H10F 39/802 |
| | | | | 257/233 |
| 2009/0303371 A1* | 12/2009 | Watanabe | | H10F 39/802 |
| | | | | 257/292 |
| 2012/0199882 A1* | 8/2012 | Shin | | H10F 39/18 |
| | | | | 257/E31.073 |
| 2019/0123093 A1 | 4/2019 | Watanabe et al. | | |
| 2019/0252428 A1 | 8/2019 | Ma et al. | | |
| 2021/0118925 A1* | 4/2021 | Zang | | H10F 39/80373 |
| 2021/0183937 A1 | 6/2021 | Zang et al. | | |
| 2021/0305296 A1* | 9/2021 | Lee | | H10F 39/8037 |
| 2022/0077215 A1* | 3/2022 | Horikoshi | | H10F 39/182 |
| 2022/0165763 A1* | 5/2022 | Kim | | H10F 39/807 |
| 2022/0406825 A1* | 12/2022 | Jin | | H10F 39/807 |
| 2023/0144105 A1* | 5/2023 | Choi | | H10F 39/80373 |
| | | | | 257/440 |
| 2023/0253436 A1 | 8/2023 | Lim et al. | | |
| 2024/0006431 A1* | 1/2024 | Machida | | H10F 39/807 |

FOREIGN PATENT DOCUMENTS

| | | | | | |
|---|---|---|---|---|---|
| KR | 10-2015-0105076 A | 9/2015 | | | |
| KR | 10-2016-0000046 A | 1/2016 | | | |
| KR | 10-2018-0076845 A | 7/2018 | | | |
| KR | 10-2019-0102767 A | 9/2019 | | | |
| KR | 10-2020-0117729 A | 10/2020 | | | |
| KR | 10-2023-0119577 A | 8/2023 | | | |
| WO | WO-2018163838 A1 * | 9/2018 | | | H10F 39/811 |
| WO | 2020/137334 A1 | 7/2020 | | | |

OTHER PUBLICATIONS

Song Chen et al., "High Conversion-Gain Pinned-Photodiode Pump-Gate Pixels in 180-nm CMOS Process", Journal of the Electron Devices Society, 2017, pp. 509-517.

Eric R. Fossum et al., "The Quanta Image Sensor: Every Photon Counts", MDPI, Sensors 2016, pp. 1-25.

* cited by examiner

IMAGE SENSOR

CROSS-REFERENCE TO RELATED APPLICATIONS

This application claims priority to Korean Patent Application Nos. 10-2022-0028272 and 10-2022-0127722, filed on Mar. 4, 2022 and Oct. 6, 2022, respectively, in the Korean Intellectual Property Office, the disclosures of which are incorporated by reference herein in their entireties.

BACKGROUND

The present disclosure relates to an image sensor and a pixel structure thereof.

An image sensing device is a semiconductor device that is used to convert an optical signal to an electrical signal. The image sensing device includes a complementary metal-oxide semiconductor (CMOS)-type image sensing device, and may be referred to as a CMOS image sensor (CIS).

The CIS includes a plurality of pixels that are two-dimensionally arranged. Each of the pixels includes a photodiode. The photodiode (PD) is configured to generate electric charges from incident light. The electric charges generated in the PD are transferred to a floating diffusion region (FD) through a transfer transistor (TX), and in this case, the transferred electric charges lead to a change in a voltage (V) of the floating diffusion region (FD). For example, the voltage (V) of the floating diffusion region (FD) may be given by an equation of $V=Qfd/Cfd$, where Cfd is a FD capacitance and Qfd is a quantity of the transferred electric charges. The voltage (V) is used as a signal that is input to a gate of a source follower (SF).

A conversion gain (CG) represents a change ($\Delta Vsl$) in an output voltage (Vsl) of the source follower, which is caused by a change ($\Delta Q$) in a quantity of electric charges in the floating diffusion region, and corresponds to a product of a gain, which is caused by the FD capacitance (Cfd), and a gain of an SF circuit.

Recently, there is an increasing demand for an image sensor with fine pixels and high operation speed, and thus, it is necessary to develop a high conversion gain (HCG) pixel capable of precisely sensing an image signal, even when the charge quantity change ($\Delta Qfd$) in the floating diffusion region is small.

SUMMARY

An embodiment provides an image sensor including a pixel having a high conversion gain (HCG) property and thereby having improved performance.

In detail, the pixel may be provided to have a gain increased by a FD capacitance, and an embodiment provides a method of operating the image sensor. Due to the high conversion gain property of the pixel, the image sensor may be used as a photon counting sensor that can sense a change in an electrical signal caused by a single photon.

According to an embodiment, an image sensor includes: a semiconductor substrate including a first surface and a second surface, which are opposite to each other; a photoelectric conversion region in the semiconductor substrate; a vertical transfer gate, which extends into the semiconductor substrate from the first surface toward the photoelectric conversion region; a floating diffusion region, which is provided in the semiconductor substrate, is spaced apart from the vertical transfer gate, and is an n-type impurity region; and a second impurity region, which is provided between the vertical transfer gate and the floating diffusion region and is a p-type impurity region.

According to an embodiment, an image sensor includes: a semiconductor substrate including a first surface and a second surface, which are opposite to each other; first to fourth pixels delimited by a deep trench isolation in the semiconductor substrate; first to fourth photoelectric conversion regions in the first to fourth pixels, respectively; first to fourth vertical transfer gates, which are provided in the first to fourth pixels, respectively, and extend into the semiconductor substrate from the first surface toward the first to fourth photoelectric conversion regions; a second impurity region, which is in the semiconductor substrate, is adjacent to the first to fourth vertical transfer gates, and is a p-type impurity region; and a common floating diffusion region, which is spaced apart from the first to fourth vertical transfer gates with the second impurity region interposed therebetween.

According to an embodiment, an image sensor includes: a semiconductor substrate including a plurality of pixels arranged in a matrix and configured to generate electrical signals; an analog-digital converter configured to convert the electrical signals to digital signals; and an accumulator configured to execute an additively-accumulating operation on the digital signals to generate an image signal. Each of the plurality of pixels includes: a vertical transfer gate, which extends from a first surface of the semiconductor substrate toward a photoelectric conversion region in the semiconductor substrate; and a floating diffusion region, which is spaced apart from the vertical transfer gate and is an n-type impurity region.

BRIEF DESCRIPTION OF DRAWINGS

The above and other aspects and features will be more apparent from the following description of example embodiments taken in conjunction with the accompanying drawings, in which.

DETAILED DESCRIPTION

Hereinafter, embodiments are described in conjunction with the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

[Image Sensor Pixel for High Conversion Gain Operation]

Figure 1:
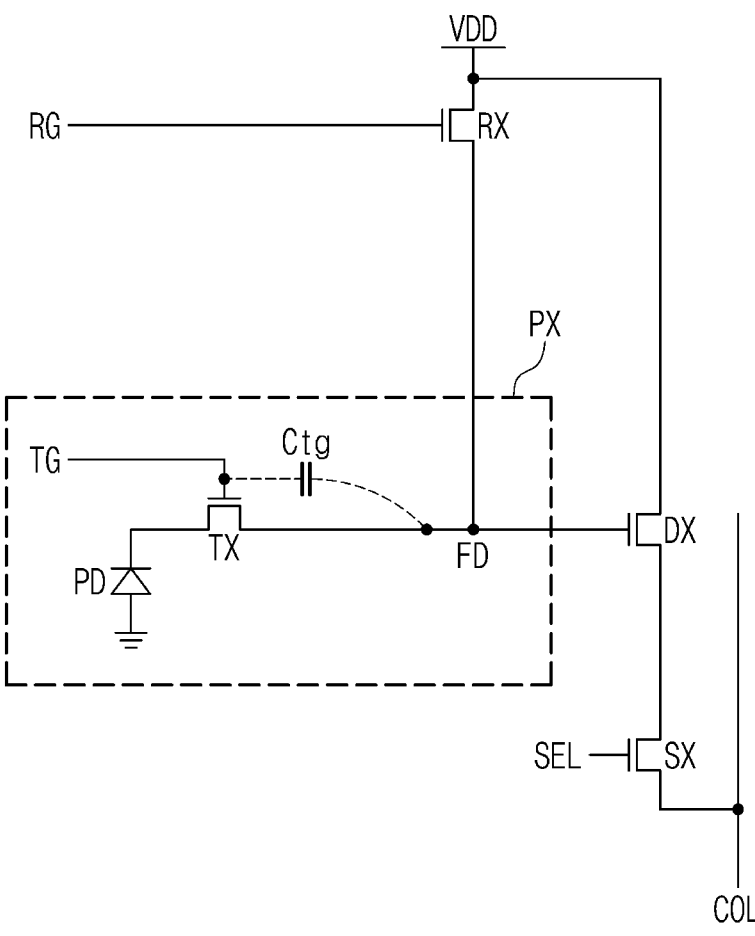
FIG. 1 is a circuit diagram illustrating a pixel of an image sensor according to an embodiment.

FIG. 1 is a circuit diagram illustrating a pixel of an image sensor according to an embodiment.

Referring to FIG. 1, the pixel of the image sensor may include a photoelectric conversion region PD, a transfer transistor TX, which is configured to transfer electric charges in the photoelectric conversion region PD to a floating diffusion region FD in response to a transfer gate signal TG, a reset transistor RX, which is configured to drain electric charges in the floating diffusion region FD in response to a reset gate signal RG, a driving transistor DX, which is configured to generate an output signal corresponding to a quantity of electric charges stored in the floating diffusion region FD, and a selection transistor SX, which is configured to output the output signal to a column line COL in response to a selection signal SEL.

The driving transistor DX may be referred to as a source follower amplifier (SF). A gate of the driving transistor DX may be connected to the floating diffusion region FD of the pixel, and a voltage input (Vin) to a source of the source follower amplifier may be substantially the same as a voltage (Vfd) of the floating diffusion region. The voltage (Vfd) of the floating diffusion region may be given as a value that is obtained by dividing a charge quantity Qfd in the floating diffusion region by an FD capacitance (Cfd); that is, Vfd=Qfd/Cfd. Here, a FD gain (Gfd) may indicate a change (ΔVfd) of the floating diffusion voltage which is caused by a change (ΔQfd) of an electric charge quantity in the floating diffusion region. Thus, the FD gain (Gfd) may be inversely proportional to the FD capacitance (Cfd).

A conversion gain (CG) may represent a change (ΔVout) of an output voltage of the source follower which is caused by a change (ΔQfd) of an electric charge quantity in the floating diffusion region and may be given by a product of the FD gain (Gfd) and a gain (Gsf) of a source follower amplifier circuit; that is, CG=Gfd×Gsf. Thus, the conversion gain (CG) may be inversely proportional to the FD capacitance (Cfd).

A signal of an output terminal of the source follower amplifier circuit may be converted to a digital signal by an analog-digital converter. A final magnitude of the digital signal may be determined in proportion to an analog gain (Gag), which is defined in the analog-digital converter. In light to a signal-to-noise ratio (SNR), it may be important to increase a gain of a front-end of a gain system. In this regard, it may be important to design a pixel in such a way to increase the conversion gain (CG). For this, it may be necessary to design the pixel in a manner of lowering the FD capacitance (Cfd).

The FD capacitance (Cfd) may be given as a sum of a first capacitance Ctg, which is produced by a gate electrode of the transfer transistor TX, a second capacitance Crg, which is produced by a gate electrode of the reset transistor RX, a third capacitance Cmt, which is produced by a metal line near the floating diffusion region FD, and a fourth capacitance Csub, which is produced by a semiconductor substrate itself; that is, Cfd=Ctg+Crg+Cmt+Csub. The FD capacitance (Cfd) may depend on the first capacitance Ctg dominantly among the four parameters (i.e., the first to fourth capacitances). In the case where the gate electrode of the transfer transistor TX is physically or spatially spaced apart from the floating diffusion region FD, the first capacitance Ctg may be decreased, and in this case, it may be possible to lower the FD capacitance (Cfd) and thereby to realize a pixel having a high conversion gain (HCG) property.

[Pixel Structure in which Vertical Transfer Gate is Spaced Apart from Floating Diffusion Region]

Figure 2:
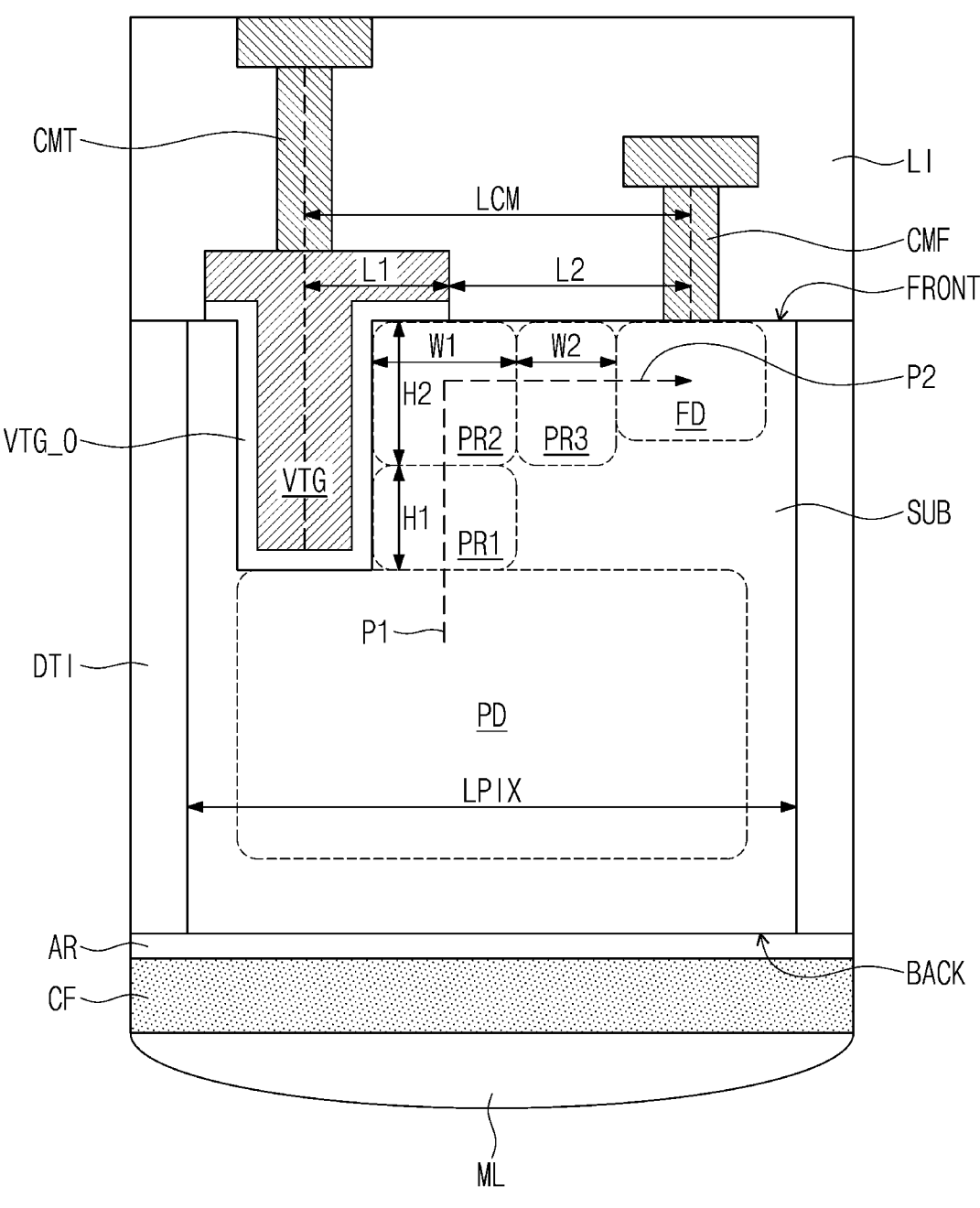
FIG. 2 is a sectional view illustrating a pixel of an image sensor according to an embodiment.

FIG. 2 is a sectional view of a pixel PX, such as the pixel PX depicted in FIG. 1, according to an embodiment.

Hereinafter, a pixel will be defined as a region, which is placed in a pixel array and corresponds to a single photodiode. Thus, a certain pixel (e.g., a 2-PD pixel for an auto-focus operation), which produces a single image signal by merging signals produced by at least two photodiodes, will be regarded as two or more pixels, based on the number of the photodiodes therein. The pixel may include additional elements, which are provided not only in a semiconductor substrate but also on first and/or second surfaces of the semiconductor substrate. For example, the additional elements may include a color filter CF, a micro lens ML, contact metals CMT and CMF, an interlayer insulating layer L1, and so forth.

Referring to FIG. 2, the pixel of the image sensor may include a semiconductor substrate SUB, a photoelectric conversion region PD, a floating diffusion region FD, a vertical transfer gate VTG, a first impurity region PR1, a second impurity region PR2, and a third impurity region PR3.

The semiconductor substrate SUB may have a first surface FRONT and a second surface BACK, which are opposite to each other. The semiconductor substrate SUB may be doped with impurities (e.g., boron (B)) of a first conductivity type (e.g., p-type), and the floating diffusion region FD may be doped with impurities (e.g., phosphorus (P) or arsenic (As)), which are of a second conductivity type (e.g., n-type) different from the semiconductor substrate SUB.

The photoelectric conversion region PD may be formed in the semiconductor substrate SUB, and light may be incident on the photoelectric conversion region PD through the second surface BACK of the semiconductor substrate SUB.

The photoelectric conversion region PD may be provided such that electric charges (e.g., photo charge) are generated in a PN junction region by an incident light and the electric charges are accumulated in a region doped with the second conductivity type (e.g., n-type) impurities.

The vertical transfer gate VTG may include a lower portion and an upper portion. The lower portion of the vertical transfer gate VTG may be a portion that extends from the first surface FRONT of the semiconductor substrate SUB into the semiconductor substrate SUB in a direction toward the photoelectric conversion region PD. The upper portion of the vertical transfer gate VTG may be a portion of the vertical transfer gate VTG that is formed above the first surface FRONT of the semiconductor substrate SUB. The upper portion of the vertical transfer gate VTG may include a portion, which is placed on the first surface FRONT of the semiconductor substrate SUB to cover a portion or the entirety of the second impurity region PR2, which will be described below. An inner portion of the vertical transfer gate VTG may be filled with a metallic material or polysilicon, and a surface of the inner portion of the vertical transfer gate VTG may be partially or fully enclosed by a gate insulating layer VTG_O. The pixel may receive a transfer signal through the vertical transfer gate VTG, and electric charges, which are generated by the photoelectric conversion region PD, may be moved to the floating diffusion region FD through the first impurity region PR1, the second impurity region PR2, and the third impurity region PR3 (i.e., along the path P1→P2) in response to the transfer signal. The transfer process of the electric charges will be described in more detail with reference to FIG. 3.

The floating diffusion region FD may be formed to be adjacent to the first surface FRONT of the semiconductor substrate SUB and to be spaced apart from the vertical transfer gate VTG. Electric charges, which are generated in the photoelectric conversion region PD, may be transferred to the floating diffusion region FD in response to the transfer gate signal TG applied to the vertical transfer gate VTG. The floating diffusion region FD may be formed by doping impurities of a second conductivity type (e.g., n-type). In the case where the floating diffusion region FD is spatially spaced apart from the vertical transfer gate VTG, it may be possible to reduce the first capacitance Ctg by the gate electrode of the transfer transistor TX.

The second impurity region PR2 may be provided between the vertical transfer gate VTG and the floating diffusion region FD. In the semiconductor substrate SUB, the second impurity region PR2 may be adjacent to the lower portion of the vertical transfer gate VTG. In addition, the second impurity region PR2 may be adjacent to the first surface FRONT of the semiconductor substrate SUB and may be adjacent to the upper portion of the vertical transfer gate VTG. The second impurity region PR2 may be of a first conductivity type (e.g., p-type). Because the second impurity region PR2 is located on a current path (P1 and P2) of the electric charges, which are generated in the photoelectric conversion region PD, the electric charges may be moved from the photoelectric conversion region PD to the floating diffusion region FD through the second impurity region PR2. The first current path P1 may be a vertical conduction path of an electric charge moving from the photoelectric conversion region PD to the first surface FRONT of the semiconductor substrate SUB, and the second current path P2 may be a horizontal conduction path of an electric charge moving from the second impurity region PR2 to the floating diffusion region FD. A doping concentration of the first conductivity type impurities in the second impurity region PR2 may be lower than a doping concentration of the first conductivity type impurities in the semiconductor substrate SUB.

The first impurity region PR1 may be located between a region of the photoelectric conversion region PD, which is doped with the second conductivity type (e.g., n-type) impurities, and the second impurity region PR2 and may be formed to be adjacent to the vertical transfer gate VTG. The first impurity region PR1 may be formed to have the first conductivity type (e.g., p-type). A doping concentration of the first conductivity type impurities in the first impurity region PR1 may be higher than a doping concentration of the first conductivity type impurities in the second impurity region PR2. The doping concentration of the first conductivity type impurities in the first impurity region PR1 may be lower than the doping concentration of the first conductivity type impurities in the semiconductor substrate SUB. The first impurity region PR1 may serve as a potential barrier against an electron and may prevent an electron from returning into the photoelectric conversion region PD, when the electron is moved from the second impurity region PR2 to the floating diffusion region FD. The third impurity region PR3 may be placed near the first surface FRONT of the semiconductor substrate SUB and between the second impurity region PR2 and the floating diffusion region FD and may be of the first conductivity type (e.g., p-type). A doping concentration of the first conductivity type impurities in the third impurity region PR3 may be lower than a doping concentration of the first conductivity type impurities in the second impurity region PR2. Thus, when the vertical transfer gate VTG is in an off state (i.e., TG Low), a potential level to an electron in the third impurity region PR3 may be between a potential level to an electron in the second impurity region PR2 and a potential level of the floating diffusion region FD. The second and third impurity regions PR2 and PR3 may be disposed between the vertical transfer gate VTG and the floating diffusion region FD. Thus, the vertical transfer gate VTG and the floating diffusion region FD may be spaced apart from each other. Accordingly, it may be possible to lower the first capacitance Ctg, which is a charge capacity between the vertical transfer gate VTG and the floating diffusion region FD. In the case where the first capacitance Ctg is lowered, it may be possible to lower the first FD capacitance Cfd, which corresponds to a sum of the first capacitance Ctg by the gate electrode of the transfer transistor TX, the second capacitance Crg by the gate electrode of the reset transistor RX, the third capacitance Cmt by the metal line connected to the floating diffusion region FD and a neighboring metal line, and the fourth capacitance Csub by the semiconductor substrate SUB (i.e., Cfd=Ctg+Crg+Cmt+Csub). As a result, the pixel may be operated with a high conversion gain, in a signal reading operation by the driving transistor DX.

A pixel of an image sensor may include a deep trench isolation DTI. In an embodiment, the deep trench isolation DTI may be formed to extend from the first surface FRONT of the semiconductor substrate SUB to a depth spaced apart from both the first surface FRONT and the back surface BACK, or to fully penetrate the semiconductor substrate SUB from the first surface FRONT to the second surface BACK. In another embodiment, the deep trench isolation DTI may be formed to extend from the second surface BACK of the semiconductor substrate SUB to a specific depth spaced apart from both the first surface FRONT and the back surface BACK, or to fully penetrate the semiconductor substrate SUB from the second surface BACK to the first surface FRONT. The deep trench isolation DTI may include an insulating layer and/or a conductive layer. As an example, the deep trench isolation DTI may include a silicon oxide layer, which is formed along an inner surface of a trench, and a silicon layer, which is formed to fill a remaining portion of the trench.

The pixel of the image sensor may further include an anti-reflection layer AR, a color filter CF, and a micro lens ML, which are provided on the second surface BACK of the semiconductor substrate SUB. A nano structure, instead of the color filter CF and/or the micro lens ML, may be provided on the second surface BACK of the semiconductor substrate SUB to separate and/or guide light, depending on a wavelength of the light.

The pixel of the image sensor may include a first contact metal CMT and a second contact metal CMF, which are provided on the first surface FRONT of the semiconductor substrate SUB. The first contact metal CMT may be used to conduct the transfer gate signal TG, which is transmitted from a row decoder, to the vertical transfer gate VTG. Depending on the reset gate signal RG, the second contact metal CMF may be used as a pathway for exhausting electric charges from the floating diffusion region FD. The first and second contact metals CMT and CMF may be encapsulated by the interlayer insulating layer L1. The interlayer insulating layer L1 may be provided to cover the upper portion of the vertical transfer gate VTG and the first surface FRONT of the semiconductor substrate SUB.

[Internal Structure of Each Pixel]

An impurity concentration may not be uniform in each of the first and second impurity regions PR1 and PR2. In this case, a boundary between the first and second impurity regions PR1 and PR2 may indicate a surface whose concentration has an average value of a concentration of the second impurity region PR2 at a position adjacent to the first surface FRONT of the semiconductor substrate SUB and a concentration of a portion of the first impurity region PR1 in contact with the photoelectric conversion region PD. A distance from the first surface FRONT of the semiconductor substrate SUB to the boundary between the first and second impurity regions PR1 and PR2 (i.e., a height H2 of the second impurity region PR2) may be longer than a distance from a top portion of the photoelectric conversion region PD to the boundary between the first and second impurity regions PR1 and PR2 (i.e., a height H1 of the first impurity region PR1).

An impurity concentration may not be uniform in each of the second and third impurity regions PR2 and PR3. In this case, a boundary between the second and third impurity regions PR2 and PR3 may indicate a surface whose concentration has an average value of a concentration of the second impurity region PR2 at a position adjacent to the lower portion of the vertical transfer gate VTG and a concentration of the third impurity region PR3 at a position adjacent to the floating diffusion region FD. A distance from a surface of the second impurity region PR2, which is adjacent to the lower portion of the vertical transfer gate VTG, to the boundary between the second and third impurity regions PR2 and PR3 (i.e., the width W1 of the second impurity region PR2) may be longer than a distance from a boundary between the floating diffusion region FD and the third impurity region PR3 to the boundary between the second and third impurity regions PR2 and PR3 (i.e., a width W2 of the third impurity region PR3).

In the case where the height and width H2 and W1 of the second impurity region PR2 are increased, a volume of the second impurity region PR2 may be increased, and the increase of the volume of the second impurity region PR2 may make it possible to transfer more electrons from the photoelectric conversion region PD to the floating diffusion region FD through a single pumping operation required by a single transfer gate signal.

A metal-to-metal distance LCM may be a distance from a center axis of the first contact metal CMT to a center axis of the second contact metal CMF. A pixel length LPIX may be a distance between two DTI structures, which are formed to be opposite to each other and to delimit a pixel region corresponding to a single photodiode. In the image sensor according to an embodiment, the metal-to-metal distance LCM may be longer than ⅓ of the pixel length LPIX. In the case where the floating diffusion region FD is adjacent to the vertical transfer gate VTG, the metal-to-metal distance LCM thereon may be equal to or smaller than ⅓ of the pixel length LPIX. In the image sensor according to an embodiment, the metal-to-metal distance LCM may be formed to have a relatively large value (e.g., longer than ⅓ of the pixel length LPIX), and in this case, it may be possible to reduce a signal interference between the first contact metal CMT and the second contact metal CMF. In addition, the first capacitance Ctg between the vertical transfer gate VTG and the floating diffusion region FD may be reduced.

A first length L1 may be a distance from a center axis of the lower portion of the vertical transfer gate VTG to an edge of the upper portion of the vertical transfer gate VTG extended toward the floating diffusion region FD. A second length L2 may be a distance from the edge of the upper portion of the vertical transfer gate VTG to a center axis of the second contact metal CMF. In the image sensor according to an embodiment, the second length L2 may be longer than ½ of the first length L1. Because, in a pixel including a related vertical transfer gate, the floating diffusion region FD is adjacent to the vertical transfer gate VTG, the second length L2 may be formed to have a value that is smaller than or equal to half of the first length L1. By contrast, in the image sensor according to an embodiment, the second length L2 may be formed to have a value greater than that in the related structure, and thus, it may be possible to lower the first capacitance Ctg between the vertical transfer gate VTG and the floating diffusion region FD.

[Pixel Operation Mechanism]

Figure 3:
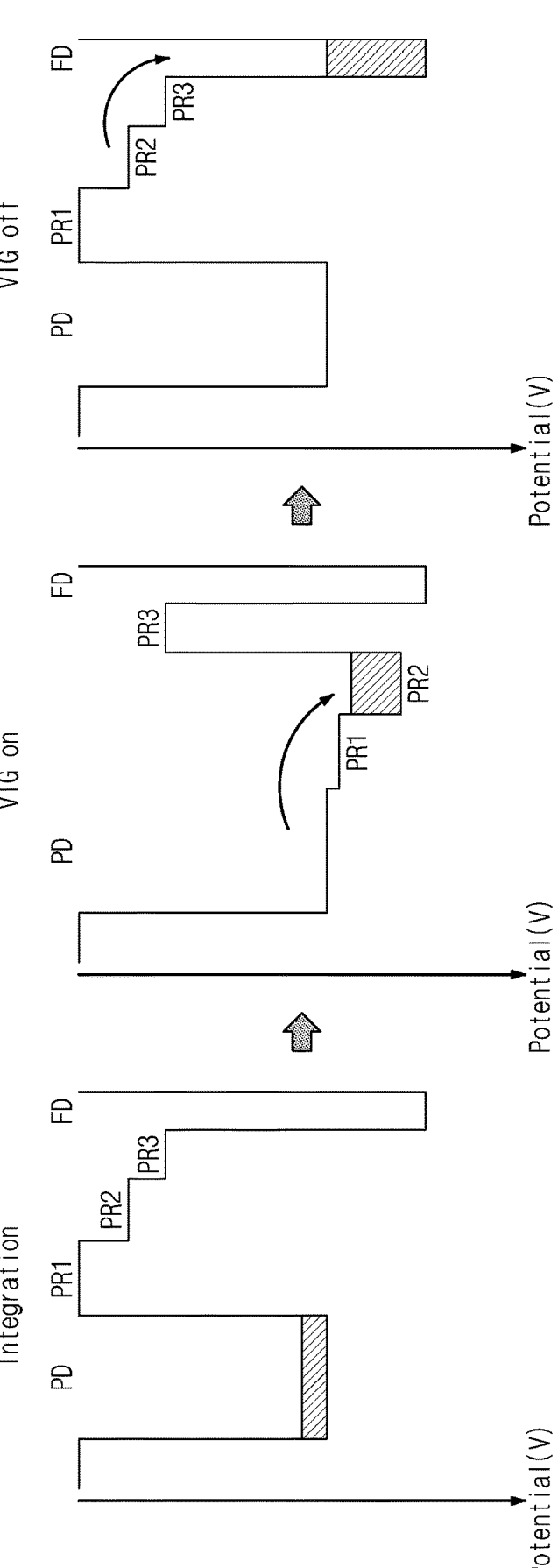
FIG. 3 is a diagram illustrating a change in a potential energy of an electron on a current path P1-P2 of FIG. 2, caused by a signal applied to a vertical transfer gate according to an embodiment.

FIG. 3 is a diagram illustrating a change in a potential energy of an electron, which is caused by a signal (e.g., TG of FIG. 1) applied to the vertical transfer gate VTG, in a region located on a current path P1-P2 of FIG. 2, according to an embodiment.

Referring to FIG. 3, an operation of the pixel according to an embodiment may include three operations: an integration operation, a vertical-transfer-gate on (VTG on) operation, and a vertical-transfer-gate off (VTG off) operation.

In the integration operation, the transfer gate signal TG may be in a state of LOW, and electric charges, which are generated by light, may be accumulated in the photoelectric conversion region PD. Because the doping concentration of the first conductivity type (e.g., p-type) impurities is lower in the second impurity region PR2 than in the first impurity region PR1 and is lower in the third impurity region PR3 than in the second impurity region PR2, electric potential energies of electrons in the first impurity region PR1, the second impurity region PR2, the third impurity region PR3 may form a double step shape in the order enumerated between the photoelectric conversion region PD and the floating diffusion region FD.

In the vertical-transfer-gate on (VTG on) operation, the transfer gate signal TG applied to the vertical transfer gate VTG may be in a state of HIGH, and the electric charges in the photoelectric conversion region PD may be transferred to the second impurity region PR2 through the first current path P1. Because the second impurity region PR2 is disposed between the third impurity region PR3 and the vertical transfer gate VTG, an influence on an electric potential energy of the third impurity region PR3 by the transfer gate signal TG may be smaller than an influence on an electric potential energy of the second impurity region PR2. Because the second impurity region PR2 and the first impurity region PR1 are disposed adjacent to the vertical transfer gate VTG, electric potential energies in the second impurity region PR2 and the first impurity region PR1 may be greatly influenced by the transfer gate signal TG, compared with an electric potential in a neighboring region (e.g., PR3). Thus, when the transfer gate signal TG is in a state of HIGH, it may be possible to selectively lower the electric potentials of electrons in the first impurity region PR1 and the second impurity region PR2, compared to the electric potential energy of an electron in the neighboring region. Here, the electric potential energies in the photoelectric conversion region PD, the first impurity region PR1, and the second impurity region PR2 may form a double step shape in the order enumerated. As a result, the electric charges in the photoelectric conversion region PD may be moved to the second impurity region PR2.

In the vertical-transfer-gate off (VTG off) operation, the transfer gate signal TG applied to the vertical transfer gate VTG may be in a state of LOW again, and the electric charges in the second impurity region PR2 may be transferred to the floating diffusion region FD through the second current path P2. The electric potential energy in the first impurity region PR1, the second impurity region PR2 and the third impurity region PR3 may be restored to the same levels as those in the integration operation. The electric potential energies of electrons in the second impurity region PR2, the third impurity region PR3, and the floating diffusion region FD may form a double step shape in the order enumerated. Thus, the electric charges in the second impurity region PR2 may be transferred to the floating diffusion region FD via the third impurity region PR3. Because the electric potential energy of an electron in the first impurity region PR1 is always higher than the electric potential energy of an electron in the second impurity region PR2, the first impurity region PR1 may serve as a potential barrier against an electron. The first impurity region PR1 may prevent electric charges from returning into the photoelectric conversion region PD, when the electric charges are moved from the second impurity region PR2 to the floating diffusion region FD.

[Various Planar Shapes of VTG and Consequent Layouts]

Figure 4A:
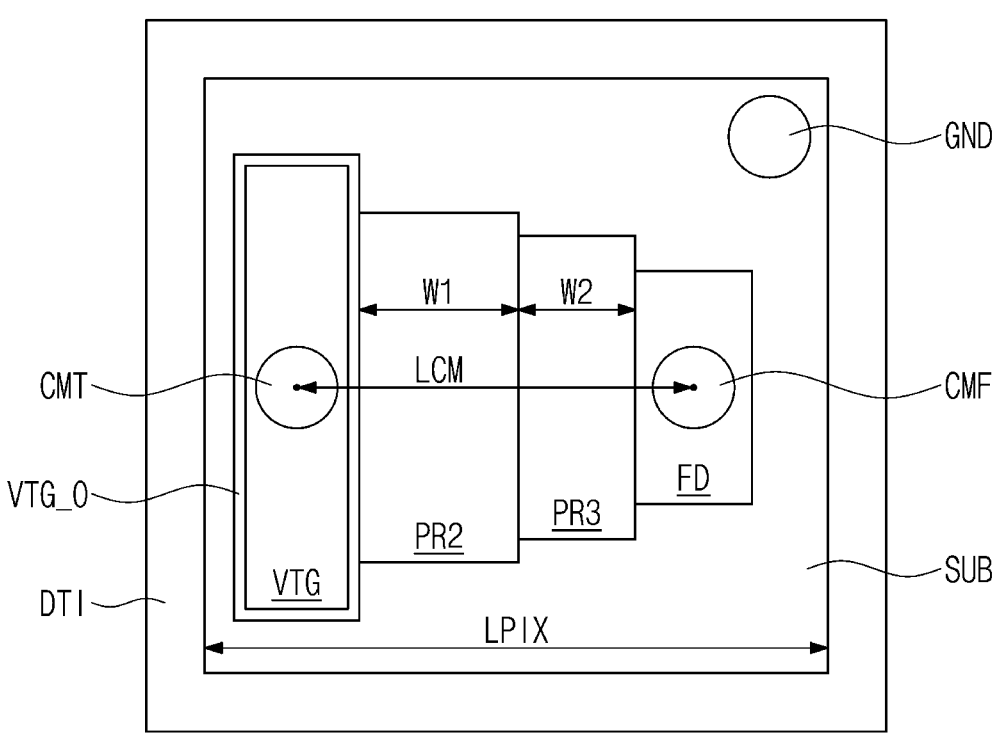
FIGS. 4A, 4B and 4C are plan views which are viewed on a first surface of FIG. 2 according to an embodiment.
Figure 4B:
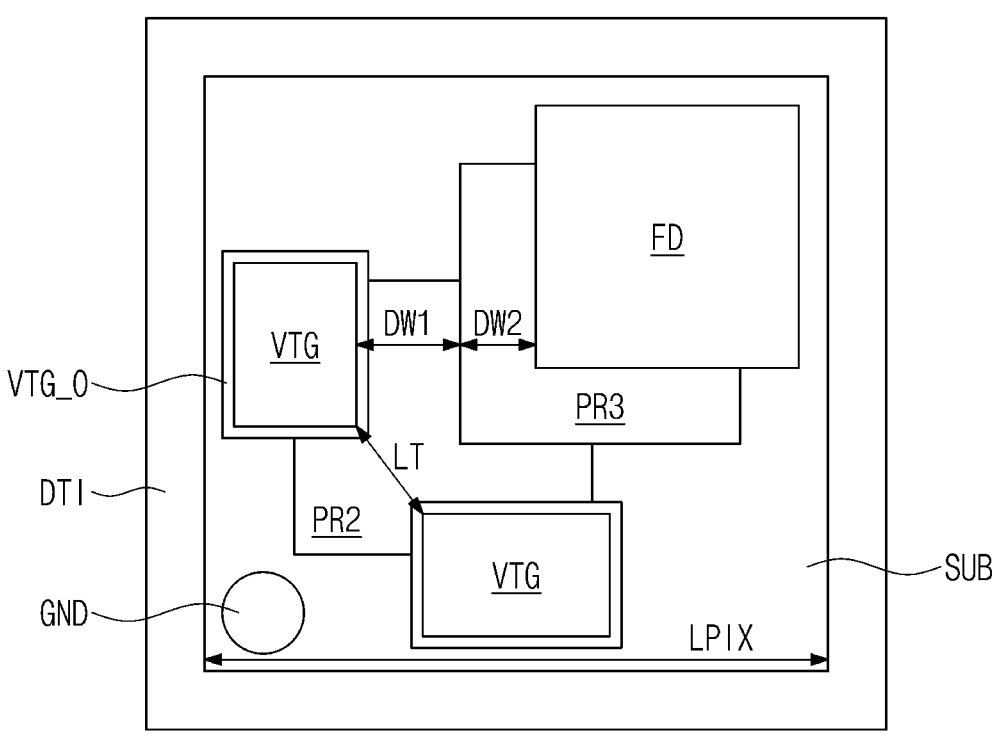
Figure 4C:
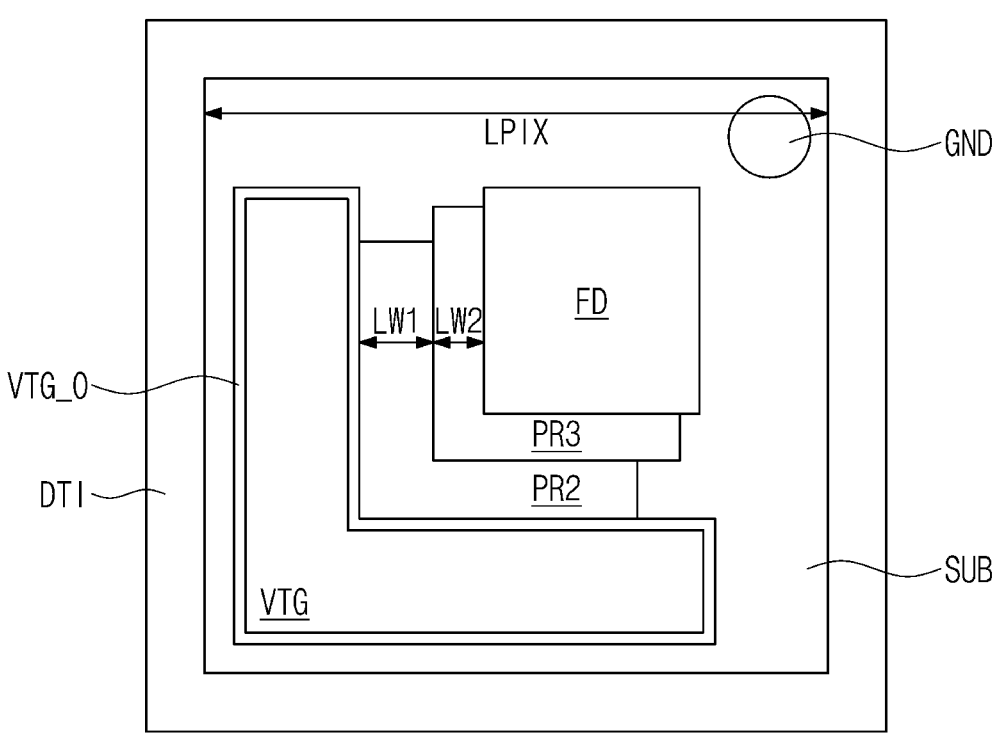

FIGS. 4A to 4C are plan views, each of which illustrates a pixel of an image sensor according to an embodiment, viewed on the first surface FRONT of the semiconductor substrate SUB. FIG. 2 is a sectional view of each of the image sensors of FIGS. 4A to 4C.

In an embodiment, the reset transistor RX, the driving transistor DX, or the selection transistor SX of FIG. 1 may be disposed on the first surface FRONT of the semiconductor substrate SUB in the pixel of the image sensor described with reference to FIGS. 4A to 4C.

In another embodiment, the reset transistor RX, the driving transistor DX, or the selection transistor SX of FIG. 1 may be formed on another semiconductor substrate, not on the semiconductor substrate SUB of FIGS. 2 and 4A to 4C. That is, the semiconductor substrate with the photoelectric conversion region PD and the transfer gate may form a vertical stacking structure, in conjunction with another semi-conductor substrate with the reset transistor RX, the driving transistor DX, or the selection transistor SX. The vertically-stacked two semiconductor substrates may be electrically connected to each other through a through-silicon via (TSV) structure or a Cu-to-Cu (C2C) structure. Here, the TSV structure may be a structure, which is formed using a technology of forming a hole to penetrate a silicon wafer, forming a penetration electrode therein, and stacking chips. The C2C structure may be a structure, which is formed by technology of connecting upper metals of upper and lower chips to each other, without forming a hole penetrating a silicon wafer.

Referring to FIGS. 4A to 4C, a portion or the entirety of the semiconductor substrate SUB in each pixel may be enclosed (i.e., surrounded) by the deep trench isolation DTI. Because each pixel is separated from neighboring pixels by the deep trench isolation DTI, it may be possible to prevent optical and/or electrical cross-talk from occurring between the pixels.

In a portion of the semiconductor substrate SUB corresponding to each pixel, the second and third impurity regions PR2 and PR3 may be disposed between the vertical transfer gate VTG and the floating diffusion region FD. Due to this structure, the gate electrode of the transfer transistor TX may be spatially spaced apart from the floating diffusion region FD, and thus, it may be possible to reduce the first capacitance Ctg and the FD capacitance (Cfd) and consequently to realize a high conversion gain operation of the pixel. The semiconductor substrate SUB may be connected to a ground contact GND.

Referring to FIG. 4A, the vertical transfer gate VTG may be formed to have a rectangular or tetragonal shape in the semiconductor substrate SUB corresponding to each pixel. Although the vertical transfer gate VTG is illustrated to have a rectangular shape, the vertical transfer gate VTG may be formed to have rounded corners or vertices or to have an elliptical shape. The section shape of the vertical transfer gate VTG is not limited to these examples and may be variously changed.

Referring to FIG. 4B, the lower portion of the vertical transfer gate VTG, which is placed below the first surface FRONT of the semiconductor substrate SUB, may be provided to have two or more gate structures which are spaced apart from each other. The two or more gate structures may be connected in common to the upper portion of the vertical transfer gate VTG, which is placed on the first surface FRONT of the semiconductor substrate SUB. That is, the vertical transfer gate VTG may include two or more gate structures, which are separated from each other in the semiconductor substrate SUB corresponding to each pixel. The upper portion of the vertical transfer gate VTG connecting the two or more gate structures may be formed of or include the same material as the lower portion thereof or as the contact metal.

An impurity concentration may not be uniform in each of the second and third impurity regions PR2 and PR3. In this case, a boundary between the second and third impurity regions PR2 and PR3 may indicate a surface whose concentration has an average value of a concentration of the second impurity region PR2 at a position adjacent to the lower portion of the vertical transfer gate VTG and a concentration of the third impurity region PR3 at a position adjacent to the floating diffusion region FD. The shortest distance from a surface of the second impurity region PR2, which is adjacent to the lower portion of one of the two vertical transfer gates VTG, to the boundary between the second and third impurity regions PR2 and PR3 (i.e., the width DW1 of the second impurity region PR2) may be longer than the shortest distance from an interface between the floating diffusion region FD and the third impurity region PR3 to the boundary between the second and third impurity regions PR2 and PR3 (i.e., the width DW2 of the third impurity region PR3).

A distance LT between the gate structures may be the shortest distance between the two gate structures, which are disposed in the semiconductor substrate SUB corresponding to each pixel, on the first surface FRONT of the semiconductor substrate SUB. In the case where the distance LT between the gate structures is small, the influence by an electric field may be increased, and this may make it possible to improve a charge transmission property of the pixel. In the image sensor according to an embodiment, the distance LT between the gate structures may be smaller than ⅓ of the pixel length LPIX.

Referring to FIG. 4C, the vertical transfer gate VTG may be a 'L'-shaped pattern that is bent at an edge region of the semiconductor substrate SUB corresponding to each pixel. The shortest distance from a surface of the second impurity region PR2, which is adjacent to the vertical transfer gate VTG, to the boundary between the second and third impurity regions PR2 and PR3 (i.e., the width LW1 of the second impurity region PR2) may be longer than the shorted distance from a surface of the third impurity region PR3, which is adjacent to the floating diffusion region FD, to the boundary between the second and third impurity regions PR2 and PR3 (i.e., the width LW2 of the third impurity region PR3).

[Structure without First and Third Impurity Regions]

Figure 5:
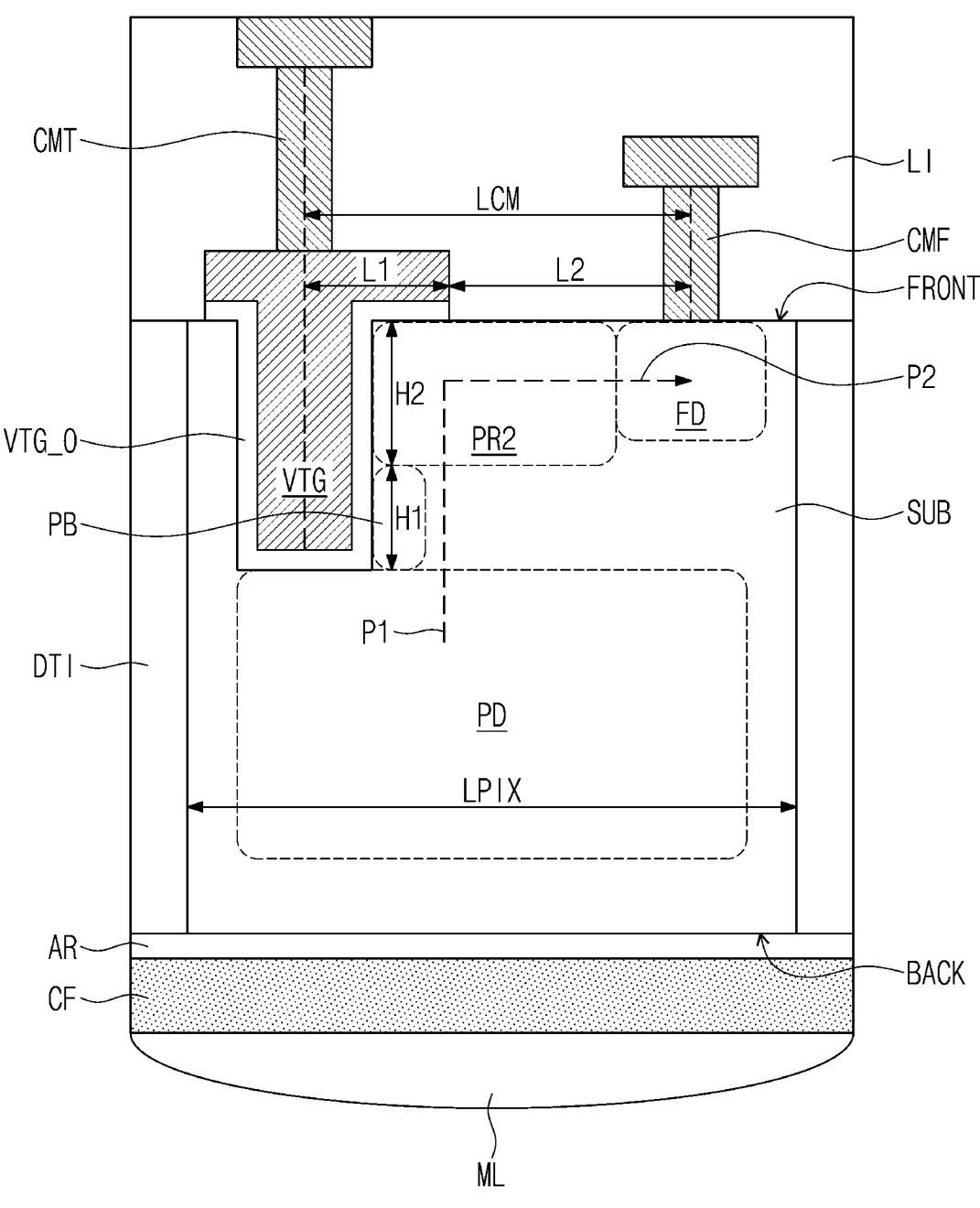
FIG. 5 is a sectional view illustrating a pixel of an image sensor according to an embodiment.

FIG. 5 is a sectional view illustrating a structure of a pixel according to an embodiment.

Referring to FIG. 5, in contrast to the pixel illustrated in FIG. 2, the first impurity region PR1 and the third impurity region PR3 may be omitted, according to an embodiment. Except for this, pixels consistent with embodiments corresponding to FIG. 2 and embodiments corresponding to FIG. 5 may have substantially the same sectional structure, and thus, features different from the structure of FIG. 2 will be described below, for concise description.

Referring to FIG. 5, the pixel of the image sensor may include the semiconductor substrate SUB, the photoelectric conversion region PD, the floating diffusion region FD, the vertical transfer gate VTG, and the second impurity region PR2.

The second impurity region PR2 may be formed in the semiconductor substrate SUB near the first surface FRONT to be adjacent to the vertical transfer gate VTG. Because the second impurity region PR2 is located on a current path (P1 and P2) of the electric charges, which are generated in the photoelectric conversion region PD, the electric charges may be moved from the photoelectric conversion region PD to the floating diffusion region FD through the second impurity region PR2. The first current path P1 may be a vertical conduction path of an electric charge moving from the photoelectric conversion region PD to the first surface FRONT of the semiconductor substrate SUB, and the second current path P2 may be a horizontal conduction path of an electric charge moving from the second impurity region PR2 to the floating diffusion region FD.

The first impurity region PR1 may be omitted from the pixel structure illustrated in FIG. 2, and the semiconductor substrate SUB may be in contact with the gate insulating layer VTG_O covering the vertical transfer gate VTG, under the second impurity region PR2 (i.e., between the second impurity region PR2 and the photoelectric conversion region PD). If the transfer gate signal TG applied to the vertical transfer gate VTG is turned on, a channel, which is an electron conduction path, may be formed in a region PB (hereinafter, an intermediate region) of the semiconductor substrate SUB, which is adjacent to the vertical transfer gate VTG. Electric charges, which are generated in the photoelectric conversion region PD, may be moved to the second impurity region PR2 through the channel.

The third impurity region PR3 may be omitted from the pixel structure illustrated in FIG. 2, and the second impurity region PR2 and the floating diffusion region FD may be in contact with each other. In a region adjacent to the first surface FRONT of the semiconductor substrate SUB, the second impurity region PR2 may be disposed between the vertical transfer gate VTG and the floating diffusion region FD. Accordingly, the vertical transfer gate VTG and the floating diffusion region FD may be spaced apart from each other, and it may be possible to reduce the first capacitance Ctg, which is a charge capacity between the vertical transfer gate VTG and the floating diffusion region FD. Thus, it may be possible to lower the FD capacitance Cfd, which corresponds to a sum of the first capacitance Ctg by the gate electrode of the transfer transistor TX, the second capacitance Crg by the gate electrode of the reset transistor RX, the third capacitance Cmt by the metal line connected to the floating diffusion region FD and a neighboring metal line, and the fourth capacitance Csub by the semiconductor substrate SUB (i.e., $Cfd = Ctg + Crg + Cmt + Csub$). As a result, the pixel may be operated with a high conversion gain, in a signal reading operation by the driving transistor DX.

When viewed in the first surface FRONT of the semiconductor substrate SUB, the second impurity region PR3 of the structure shown in FIGS. 4A to 4C may be omitted from the pixel of FIG. 5, and the second impurity region PR2 may be provided to be in contact with the floating diffusion region FD.

[Pixel Operation in Structure without First and Third Impurity Regions]

Figure 6:
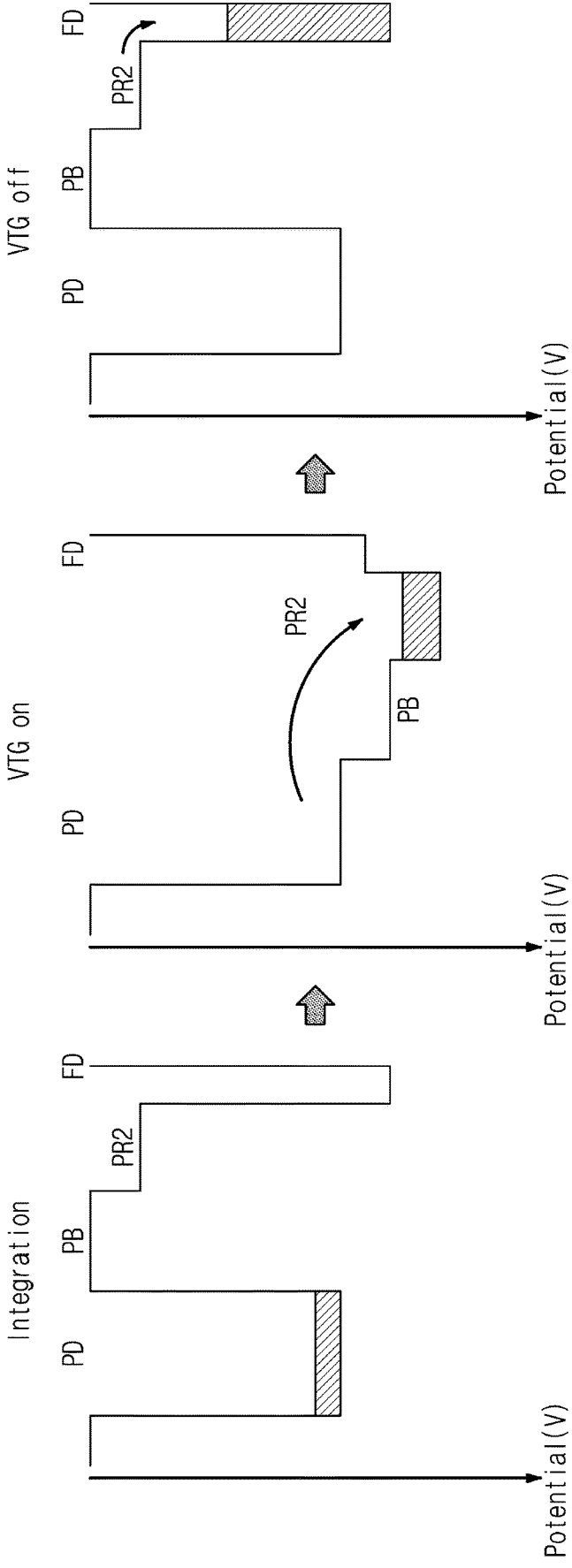
FIG. 6 is a diagram illustrating a change in a potential energy of an electron on a current path P1-P2 of FIG. 5, caused by a signal applied to a vertical transfer gate according to an embodiment.

FIG. 6 is a diagram illustrating a change in a potential energy on a current path P1-P2 of FIG. 5, caused by a signal applied to a vertical transfer gate.

Referring to FIG. 6, an intermediate region PB may be a region of the semiconductor substrate SUB, which is located under the second impurity region PR2 and is adjacent to the vertical transfer gate VTG. If the transfer gate signal TG applied to the vertical transfer gate VTG is in a state of HIGH, electric charges, which are generated in the photoelectric conversion region PD, may be transferred to the second impurity region PR2 through a channel, which is formed on the intermediate region PB.

An operation of the pixel according to an embodiment may include three operations: an integration operation, a vertical-transfer-gate on (VTG on) operation, and a vertical-transfer-gate off (VTG off) operation.

In the integration operation, the transfer gate signal TG may be in a state of LOW, and electric charges, which are generated by light, may be accumulated in the photoelectric conversion region PD. The intermediate region PB may include impurities, which are of the same conductivity type (e.g., the first conductivity type) as the semiconductor substrate SUB. A doping concentration of the first conductivity type (e.g., p-type) impurities may be lowered in the second impurity region PR2 than in the intermediate region PB, and in this case, because the floating diffusion region FD is doped with the second conductivity type (e.g., n-type) impurities, electric potential energies of electrons in the intermediate region PB, the second impurity region PR2, and the floating diffusion region FD may form a double step shape in the order enumerated.

In the vertical-transfer-gate on (VTG on) operation, the transfer gate signal TG may be HIGH, and electric charges of the photoelectric conversion region PD may be moved to the second impurity region PR2 through the first current path P1. Because the second impurity region PR2 and the intermediate region PB are disposed to be adjacent to the vertical transfer gate VTG, the electric potential energies in the second impurity region PR2 and the intermediate region PB may be greatly influenced by the transfer gate signal TG, compared with the electric potential energy in a neighboring region (e.g., FD). Thus, when the transfer gate signal TG is in a state of HIGH, it may be possible to selectively lower the electric potentials in the second impurity region PR2 and the intermediate region PB. The electric potential energies in the photoelectric conversion region PD, the intermediate region PB, and the second impurity region PR2 may form a double step shape in the order enumerated. Thus, electric charges, which are generated in the photoelectric conversion region PD, may be transferred to the second impurity region PR2.

The vertical-transfer-gate off (VTG off) operation may be an operation, in which the transfer gate signal TG is LOW again and the electric charges of the second impurity region PR2 are moved to the floating diffusion region FD through the second current path P2. The electric potential energy in each region may be restored to the same levels as those in the integration operation. The electric potential energies of electrons in the intermediate region PB, the second impurity region PR2, and the floating diffusion region FD may form a double step shape in the order enumerated. Thus, the electric charges of the second impurity region PR2 may be moved to the floating diffusion region FD.

[Example of Ring-Type VTG]

Figure 7A:
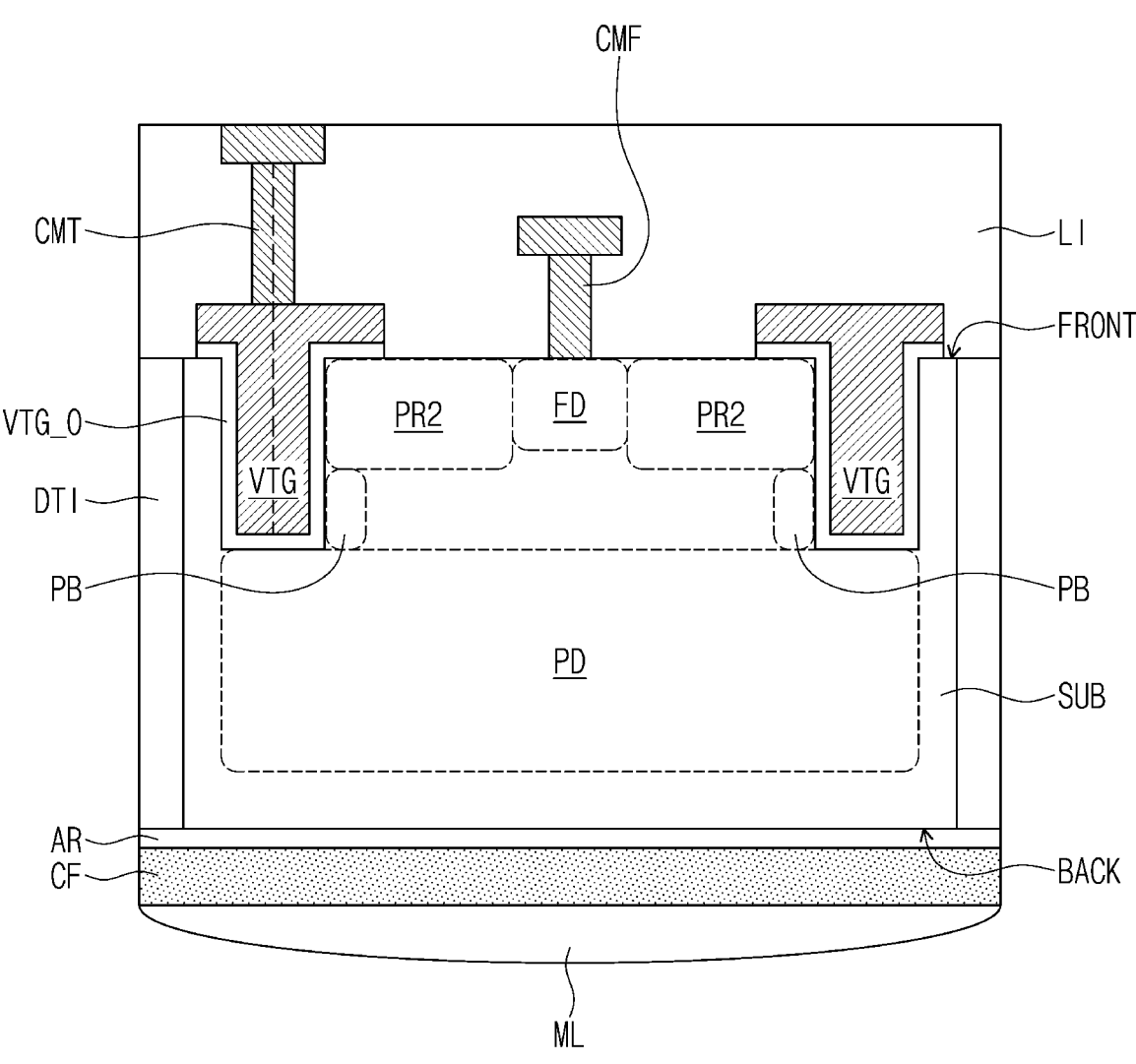
FIG. 7A is a sectional view illustrating a pixel structure according to an embodiment.

FIG. 7A is a pixel sectional view illustrating an example, in which the vertical transfer gate VTG according to an embodiment is formed in a ring shape.

Figure 7B:
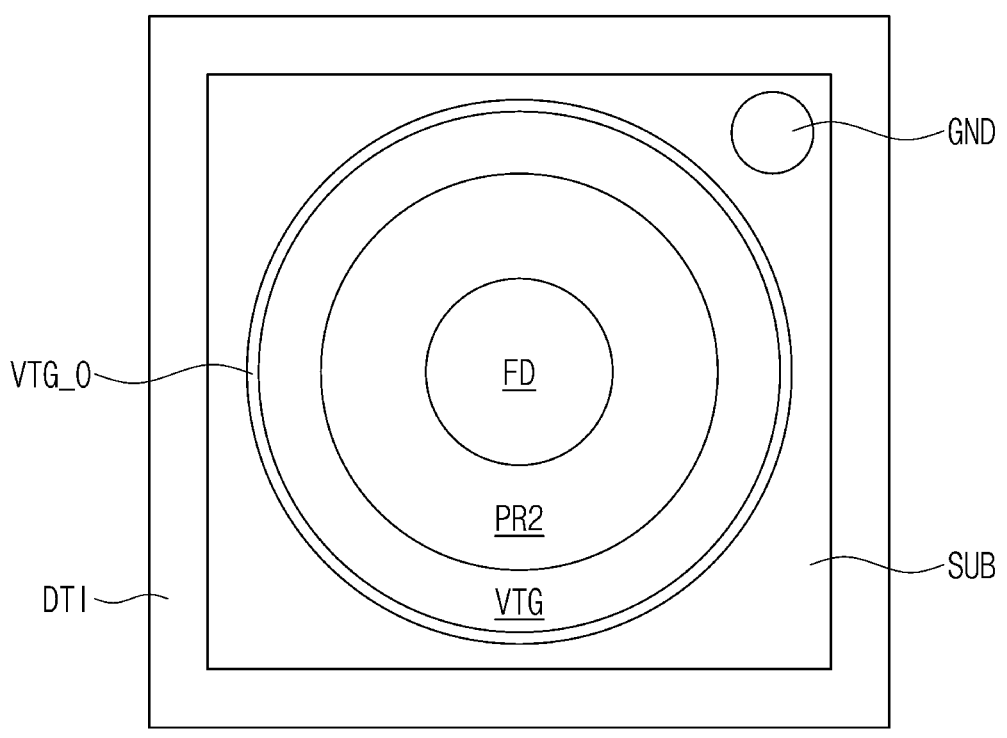
FIG. 7B is a plan view viewed on a first surface of FIG. 7A according to an embodiment.

FIG. 7B is a plan view illustrating positions of the vertical transfer gate VTG, the second impurity region PR2, and the floating diffusion region FD, viewed on the first surface FRONT of FIG. 7A.

For concise description, an element described with reference to FIGS. 2 to 4 may be identified by the same reference number without repeating an overlapping description thereof. Referring to FIGS. 7A and 7B, the vertical transfer gate VTG may be formed near a trench, which is formed near an edge portion of the pixel and near the first surface FRONT of the semiconductor substrate SUB and has a vertically-recessed ring shape. The second impurity region PR2 may be formed to have a ring shape in an inner region, which is surrounded by the vertical transfer gate VTG placed on the first surface FRONT of the semiconductor substrate SUB. The floating diffusion region FD may be provided in the ring-shaped second impurity region PR2 to be adjacent to the first surface FRONT of the semiconductor substrate SUB.

Electric charges, which are generated in the photoelectric conversion region PD, may be transferred to the second impurity region PR2 through a channel, which is formed in the intermediate region PB, and here, the channel may be selectively formed by a voltage applied to the vertical transfer gate VTG, which is formed in an edge portion of the pixel and is adjacent to the intermediate region PB.

[Structure, in which One FD is Shared by a Plurality of Pixels]

Figure 8:
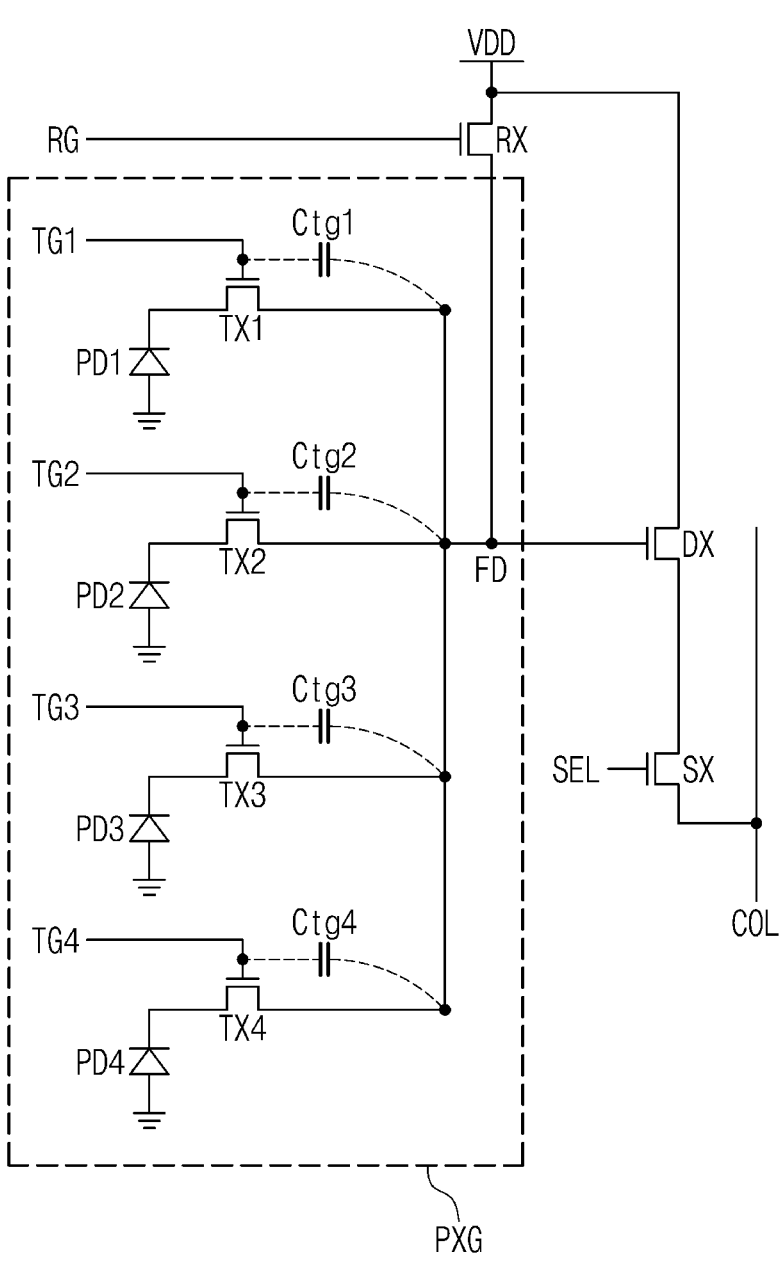
FIG. 8 is a circuit diagram illustrating a pixel of an image sensor according to an embodiment.

FIG. 8 is a circuit diagram illustrating a pixel of an image sensor according to an embodiment.

Referring to FIG. 8, the pixel of the image sensor may include the photoelectric conversion region PD, transfer transistors TX1-TX4, which are configured to transfer electric charges in the photoelectric conversion region PD to the floating diffusion region FD in response to the transfer gate signal TG, the reset transistor RX, which is configured to reset the floating diffusion region FD in response to the reset gate signal RG, the driving transistor DX, which is configured to generate an output signal corresponding to a quantity of electric charges stored in the floating diffusion region FD, and the selection transistor SX, which is configured to output the output signal to the column line COL in response to the selection signal SEL.

A size of the driving transistor DX may be a key factor greatly affecting performance of the pixel. The larger the driving transistor DX, the better the noise. To increase the size of the driving transistor DX within a given area, several photoelectric conversion regions (e.g., PD1 to PD4) and a plurality of transfer transistors TX1-TX4 may be configured to share one floating diffusion region FD and one driving transistor DX. In FIG. 8, four photoelectric conversion regions PD1 to PD4 are illustrated to share one driving transistor DX, but in an embodiment, the number of the photoelectric conversion regions sharing the driving transistor DX may be greater or smaller than four.

The FD capacitance (Cfd) may be given as a sum of a first capacitance (Ctg1+Ctg2+Ctg3+Ctg4) by the gate electrodes of the transfer transistors TX1-TX4, a second capacitance Crg by the gate electrode of the reset transistor RX, a third capacitance Cmt by the metal line connected to the floating diffusion region FD and a neighboring metal line, and a fourth capacitance Csub by the semiconductor substrate SUB. In the case where, as shown in FIG. 8, several transfer transistors TX1-TX4 are connected to one floating diffusion region FD, the first capacitance (Ctg1+Ctg2+Ctg3+Ctg4) may be increased. Thus, the FD capacitance (Cfd) may also be increased, and this may make it difficult to achieve a high conversion gain in an operation. Some embodiments, which have a structure sharing the floating diffusion region FD of FIG. 8 but can overcome the above difficulty, will be described in more detail with reference to FIGS. 9 and 10A to FIG. 10C.

Figure 9:
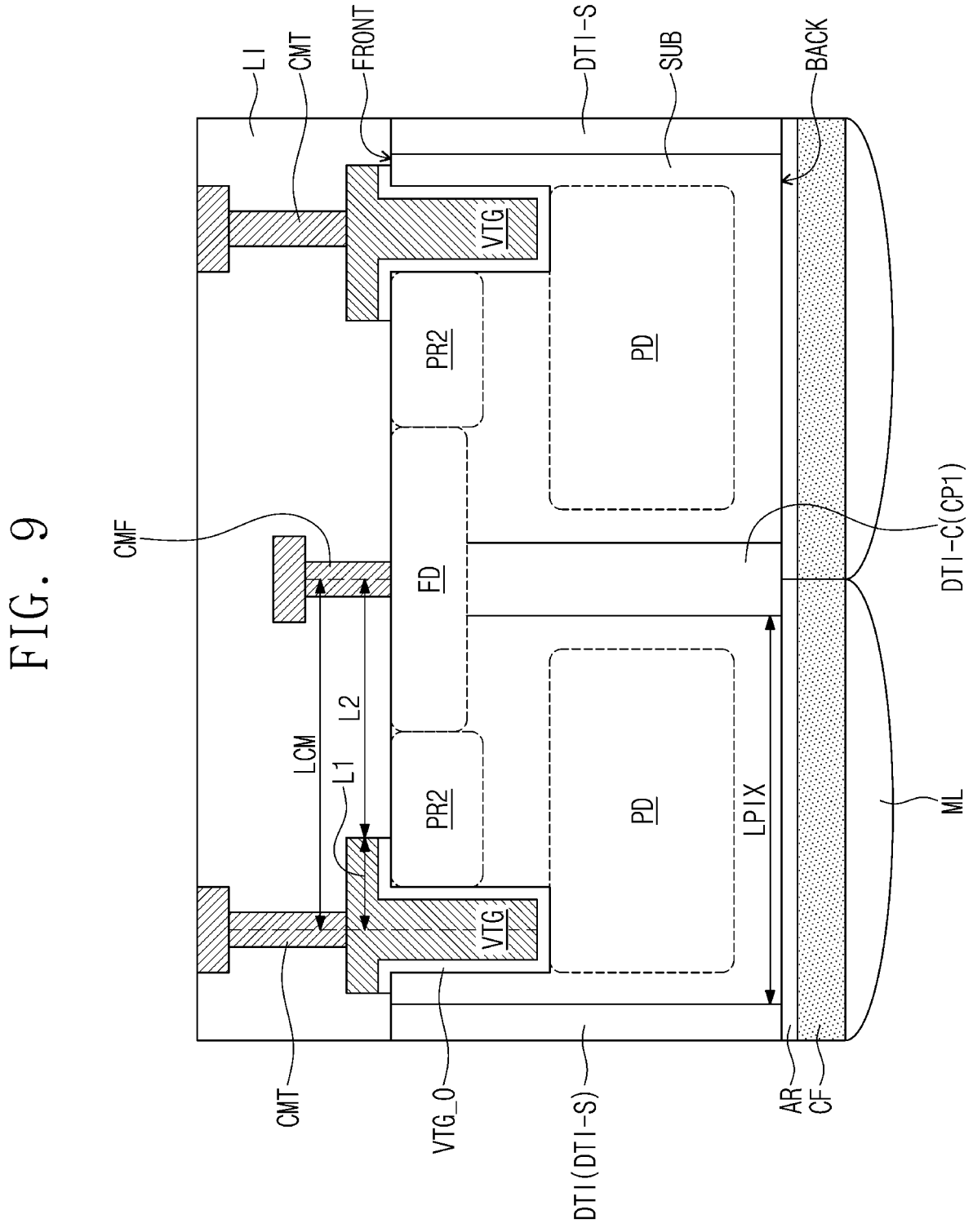
FIG. 9 is a sectional view of a pixel structure according to an embodiment.

FIG. 9 is a sectional view of a pixel group PXG (e.g., of FIG. 8) according to an embodiment.

Referring to FIG. 9, the pixel of the image sensor may include the semiconductor substrate SUB, the photoelectric conversion region PD, the floating diffusion region FD, the vertical transfer gate VTG, and the second impurity region PR2.

In some embodiments, the first impurity region PR1 may be additionally provided below the second impurity region PR2, and the third impurity region PR3 may be additionally provided between the second impurity region PR2 and the vertical transfer gate VTG, similar to the embodiment of FIG. 2.

The semiconductor substrate SUB may have a first surface FRONT and a second surface BACK, which are opposite to each other. The semiconductor substrate SUB may be doped with impurities (e.g., boron (B)) of a first conductivity type (e.g., p-type), and the floating diffusion region FD may be doped with impurities (e.g., phosphorus (P) or arsenic (As)), which are of a second conductivity type (e.g., n-type) different from the semiconductor substrate SUB.

The photoelectric conversion region PD may be formed in the semiconductor substrate SUB, and light may be incident on the photoelectric conversion region PD through the second surface BACK of the semiconductor substrate SUB.

The photoelectric conversion region PD may be provided such that electric charges (e.g., photo charge) are generated in a PN junction region by an incident light and the electric charges are accumulated in a region doped with the second conductivity type (e.g., n-type) impurities.

The vertical transfer gate VTG may be formed in a trench, which is vertically recessed from the first surface FRONT of the semiconductor substrate SUB to the photoelectric conversion region PD. An inner portion of the vertical transfer gate VTG may be filled with a metallic material or polysilicon, and a surface of the inner portion of the vertical transfer gate VTG may be enclosed by the gate insulating layer VTG_O. The pixel may receive a transfer signal through the vertical transfer gate VTG, and may transfer the electric charges, which are generated in the photoelectric conversion region PD, the floating diffusion region FD through the second impurity region PR2 in response to the transfer signal.

The second impurity region PR2 may be provided between the vertical transfer gate VTG and the floating diffusion region FD. In the semiconductor substrate SUB, the second impurity region PR2 may be adjacent to the lower portion of the vertical transfer gate VTG. In addition, the second impurity region PR2 may be adjacent to the first surface FRONT of the semiconductor substrate SUB and may be adjacent to the upper portion of the vertical transfer gate VTG. Because the second impurity region PR2 is located on a current path (P1 and P2) of the electric charges, which are generated in the photoelectric conversion region PD, the electric charges may be moved from the photoelectric conversion region PD to the floating diffusion region FD through the second impurity region PR2.

The second impurity region PR2 may be disposed between the vertical transfer gate VTG and the floating diffusion region FD. Accordingly, the vertical transfer gate VTG and the floating diffusion region FD may be spaced apart from each other, and it may be possible to lower the first capacitance Ctg, which is a charge capacity between the vertical transfer gate VTG and the floating diffusion region FD. Thus, it may be possible to lower the FD capacitance Cfd, which corresponds to a sum of the first capacitance Ctg by the gate electrode of the transfer transistor TX, the second capacitance Crg by the gate electrode of the reset transistor RX, the third capacitance Cmt by the metal line connected to the floating diffusion region FD and a neighboring metal line, and the fourth capacitance Csub by the semiconductor substrate (i.e., Cfd=Ctg+Crg+Cmt+Csub). As a result, the pixel may be operated with a high conversion gain, in a signal reading operation by the driving transistor DX.

A pixel of an image sensor may include a deep trench isolation DTI. In an embodiment, the deep trench isolation DTI may extend from the first surface FRONT of the semiconductor substrate SUB to a specific depth or may be formed to fully penetrate the semiconductor substrate SUB from the first surface FRONT to the second surface BACK. In another embodiment, the deep trench isolation DTI may extend from the second surface BACK of the semiconductor substrate SUB to a specific depth or may be formed to fully penetrate the semiconductor substrate SUB. The deep trench isolation DTI may include a first isolation region DTI-S and a second isolation region DTI-C. In detail, the first isolation region DTI-S, which is formed in edge portions of four pixels sharing one floating diffusion region FD, may be formed to fully penetrate the semiconductor substrate SUB from the first surface FRONT to the second surface BACK.

Figure 10A:
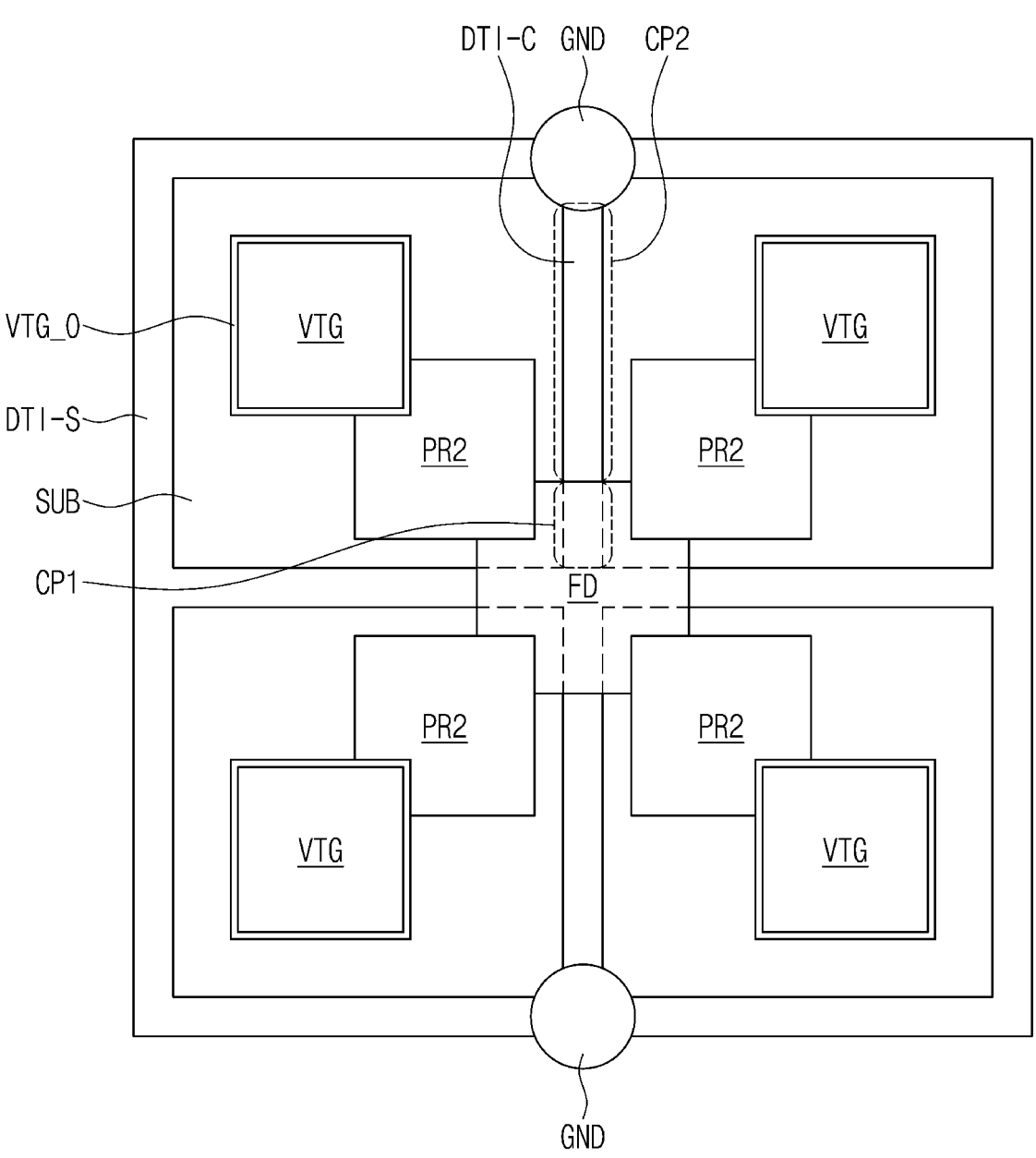
FIGS. 10A, 10B, and 10C are plan views which are viewed on a first surface of FIG. 9 according to an embodiment.

The second isolation region DTI-C, which is formed between the four pixels sharing one floating diffusion region, may include a first isolating portion CP1, which is formed from the second surface BACK of the semiconductor substrate SUB to a depth separated from the first surface FRONT (see FIGS. 10A, B, and C), and a second isolating portion CP2, which is formed to penetrate the semiconductor substrate SUB from the second surface BACK to the first surface FRONT (see FIGS. 10A, B, and C). The first isolating portion CP1 of the second isolation region DTI-C may have a top surface that is spaced apart from the first surface FRONT of the semiconductor substrate SUB.

The floating diffusion region FD may be formed between the top surface of the first isolating portion CP1, which is formed between the four pixels, and the first surface FRONT of the semiconductor substrate SUB. Electric charges, which are generated in the photoelectric conversion region PD, may be transferred to the floating diffusion region FD by the vertical transfer gate VTG and may then be stored in the floating diffusion region FD. The floating diffusion region FD may be formed by doping impurities of a second conductivity type (e.g., n-type). The four pixels may share one floating diffusion region FD.

In an embodiment, the pixel of the image sensor may include the color filter CF and the micro lens ML, which are provided on the second surface BACK of the semiconductor substrate SUB. A nano structure, instead of the color filter CF or the micro lens ML, may be placed on the second surface BACK of the semiconductor substrate SUB to separate or guide light, depending on a wavelength of the light. Some geometric features (e.g., the first and second lengths L1 and L2) in the pixel according to the present embodiment may be substantially the same as those in the embodiment described with reference to FIG. 2.

Figure 10B:
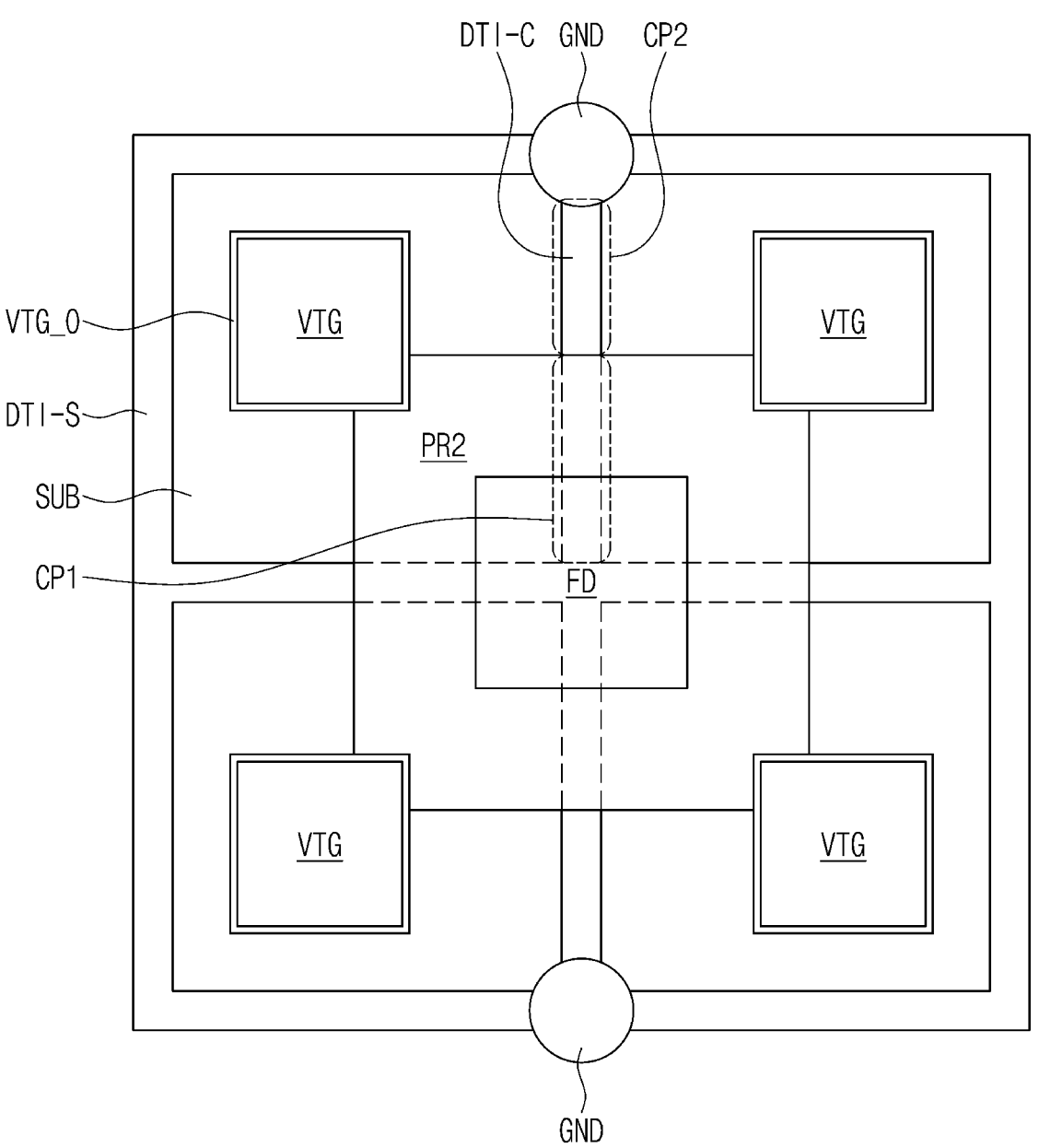
Figure 10C:
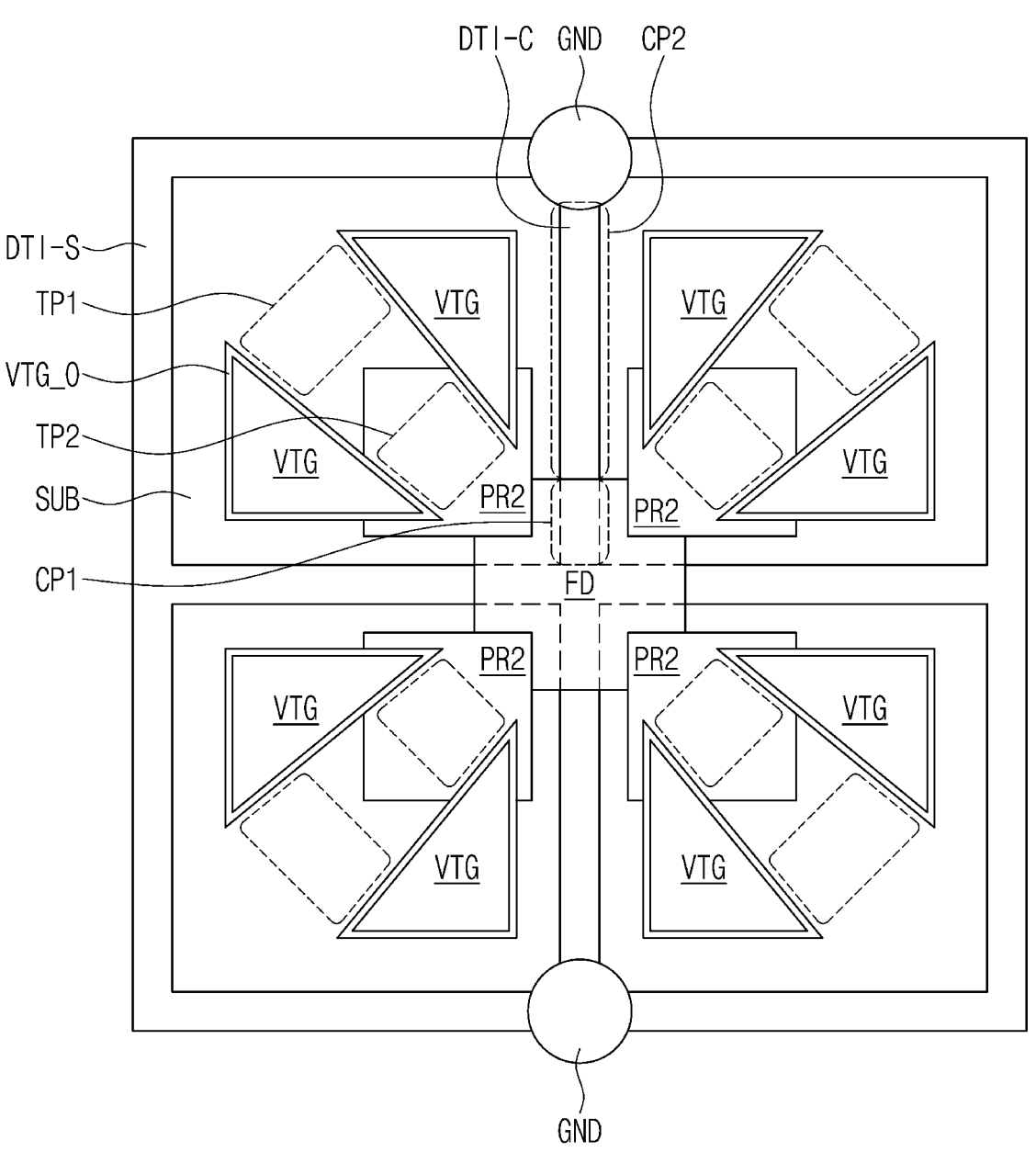

FIGS. 10A, 10B, and 10C are plan views of pixels having the sectional structure of FIG. 9, viewed from the first surface FRONT of the semiconductor substrate SUB.

In an embodiment, the reset transistor RX, the driving transistor DX, or the selection transistor SX of FIG. 8 may be disposed on the first surface FRONT of the semiconductor substrate SUB of the image sensor shown in FIGS. 10A, 10B, and 10C.

In another embodiment, the reset transistor RX, the driving transistor DX, or the selection transistor SX of FIG. 8 may be formed on another semiconductor substrate, not on the semiconductor substrate SUB with the pixel of FIGS. 10A, 10B, and 10C. For example, a semiconductor substrate with the photoelectric conversion region PD and the transfer gate and another semiconductor substrate with the reset transistor RX, the driving transistor DX, or the selection transistor SX may be provided to form a vertical stacking structure and may be electrically connected to each other.

Referring to FIGS. 10A, 10B, and 10C, the first isolation region DTI-S, which is formed in edge portions of four pixels sharing one floating diffusion region FD, may be formed to fully penetrate the semiconductor substrate SUB from the first surface FRONT to the second surface BACK. A portion or the entirety of the second isolation region DTI-C, which is formed between the four pixels sharing one floating diffusion region, may be locally formed in a region, which extends from the second surface BACK of the semiconductor substrate SUB to a depth separated from the first surface FRONT.

The second impurity region PR2 may be disposed between the vertical transfer gate VTG and the floating diffusion region FD. Due to this structure, the gate electrode of the transfer transistor TX may be spatially spaced apart from the floating diffusion region FD, and thus, it may be possible to reduce the first capacitance Ctg and the FD capacitance (Cfd) and consequently to realize a high conversion gain operation of the pixel.

Referring to FIG. 10A, the vertical transfer gate VTG and the second impurity region PR2 may be separately disposed in each pixel region. The floating diffusion region FD may be spaced apart from the vertical transfer gates VTG of the pixels, on the first surface FRONT of the semiconductor substrate SUB located on the first isolating portion CP1 of the second isolation region DTI-C. The second impurity regions PR2 of the pixels may be spaced apart from each other by the second isolating portion CP2 of the second isolation region DTI-C.

Referring to FIG. 10B, the vertical transfer gate VTG may be separately disposed in each pixel region. The floating diffusion region FD may be spaced apart from the vertical transfer gates VTG of the pixels, on the first surface FRONT of the semiconductor substrate SUB located on the first isolating portion CP1 of the second isolation region DTI-C.

The second impurity region PR2 may be formed to have a ring shape enclosing the floating diffusion region FD, near the first surface FRONT of the semiconductor substrate SUB. As an example, one second impurity region PR2 may extend into a region between the vertical transfer gates VTG of the pixels and the floating diffusion region FD and may be shared by the vertical transfer gates VTG of the pixels. The second impurity region PR2 may extend to a region on the first isolating portion CP1 of the second isolation region DTI-C.

Referring to FIG. 10C, similar to the embodiment of FIG. 4B, each of the vertical transfer gates VTG, which are respectively disposed in the pixels, may include two or more gate structures, which are placed below the first surface FRONT of the semiconductor substrate SUB and are spaced apart from each other. In an embodiment, as shown in FIG. 10C, each of the vertical transfer gates VTG of the pixels may include two gate structures. The two or more gate structures may be connected in common to the upper portion of the vertical transfer gate VTG, which is placed on the first surface FRONT of the semiconductor substrate SUB. That is, the vertical transfer gate VTG may include two or more gate structures, which are separated from each other in the semiconductor substrate SUB corresponding to each pixel. The upper portion of the vertical transfer gate VTG connecting the two or more gate structures may be formed of or include the same material as the lower portion thereof or as the contact metal.

The floating diffusion region FD may be spaced apart from the vertical transfer gates VTG of the pixels, on the first surface FRONT of the semiconductor substrate SUB located on the first isolating portion CP1 of the second isolation region DTI-C. Thus, near the first surface FRONT of the semiconductor substrate SUB, each of the vertical transfer gates VTG may be enclosed by a material of the first conductivity type (e.g., p-type). The second impurity regions PR2 of the pixels may be spaced apart from each other by the second isolating portion CP2 of the second isolation region DTI-C.

In the case where the lower portion of the vertical transfer gate VTG in each pixel region is divided into two gate structures, a charge transfer region, which is located between the two gate structures, may include a first transfer region TP1, which is far from the floating diffusion region FD, and a second transfer region TP2, which is close to the floating diffusion region FD. A distance between the two gate structures, which are spaced apart from each other at the first transfer region TP1, may be greater than a distance between the two gate structures, which are spaced apart from each other at the second transfer region TP2. Due to this structure, there may be a spatial variation in an electric field between the two gate structures, and this may make it possible for electric charges to be more easily transferred to the floating diffusion region FD. A concentration of the first conductivity type (e.g., p-type) impurities in the first transfer region TP1 may be higher than a concentration of the first conductivity type (e.g., p-type) impurities in the second transfer region TP2. This difference in the impurity concentration may also produce the electric field, and thus, the electric charges may be more easily transferred to the floating diffusion region FD.

[Image Sensor Including Accumulator for Cumulative Addition Operation]

Figure 11:
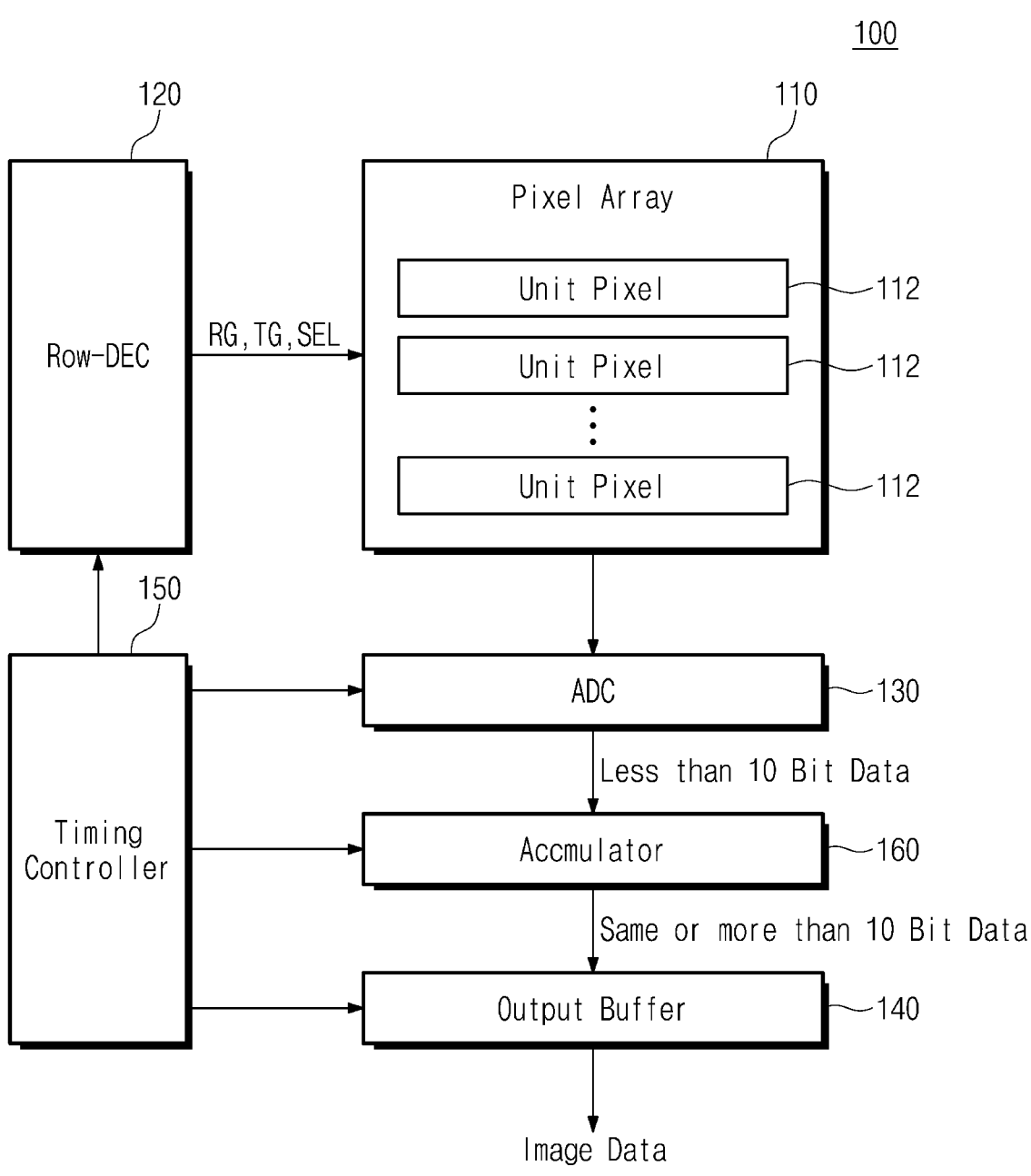
FIG. 11 is a block diagram illustrating an image sensor according to an embodiment.

FIG. 11 is a block diagram illustrating an image sensor according to some embodiments.

Referring to FIG. 11, an image sensor 100 may include a pixel array 110, a row decoder 120, an analog-digital converter (ADC) 130, an output buffer 140, a timing controller 150, and an accumulator 160.

The pixel array 110 may include a plurality of unit pixels 112. In an embodiment, the unit pixels 112 may be arranged in a matrix shape. The pixel array 110 may receive sensor pixel driving signals (e.g., the selection signal SEL, the reset gate signal RG, and the transfer gate signal TG) from the row decoder 120. The pixel array 110 may be controlled and operated by the received sensor pixel driving signals, and each of the unit pixels 112 may convert an optical signal to an electrical signal. In addition, the electrical signal, which is generated by each of the unit pixels 112, may be provided to the analog-digital converter 130 through a plurality of column lines. In still other embodiments, the electrical signal, which is generated by each of the unit pixels 112, may be provided to each analog-digital converter 130, which is connected to each cluster composed of each pixel or several pixels.

In an embodiment, each of the plurality of unit pixels 112, which are included in the pixel array 110, may include a vertical transfer gate and a floating diffusion region, which are spatially spaced apart from each other. The floating diffusion region may be doped with impurities of a second conductivity type (e.g., an n-type). A region, which is doped with impurities of a first conductivity type (e.g., a p-type), may be provided between the vertical transfer gate and the floating diffusion region. Due to the region doped with the impurities of the first conductivity type (e.g., the p-type), the vertical transfer gate and the floating diffusion region may be spaced apart from each other, and thus, the FD capacitance (Cfd) may be lowered. A structure and an operation of each of the unit pixels 112 according to an embodiment have been described in detail with reference to FIGS. 1 to 10.

The row decoder 120 may select one row of the pixel array 110, under control of the timing controller 150. The row decoder 120 may generate the selection signal SEL, which is used to select one row of a plurality of rows. The row decoder 120 may activate the reset gate signal RG and the transfer gate signal TG for unit pixels corresponding to the selected row in the predetermined order. Thereafter, reset level signals, sensing signals, and so forth, which are generated from each of the unit pixels 112 of the selected row, may be delivered to the analog-digital converter 130.

The analog-digital converter 130 may convert the reset level signals and the sensing signals to digital signals, and may then output the converted digital signals. For example, the analog-digital converter 130 may be configured to execute a sampling operation on the reset level signals and the sensing signals in a correlated double sampling manner and to convert them to the digital signals. For this, a correlated double sampler (CDS) may be further disposed at a front end of the analog-digital converter 130.

In an embodiment, when each pixel signal is read out by a driving transistor, the pixel may be operated with an exceedingly high conversion gain. In this case, the pixel may be used as a photon counting pixel that senses a very weak light (e.g., a single photon) and generates a different level of an electrical signal. Here, the analog-digital converter 130 may receive a time-divided small sensing signal, may convert it to a unit digital signal, and then, may output the unit digital signal.

In an image sensor according to an embodiment, the floating diffusion region may have a small charge capacity, and in this case, there may be a difficulty in generating complete image data through a single readout operation. The accumulator 160 may include a memory device (e.g., a DRAM or SRAM chip). The accumulator 160 may receive a unit digital signal, which may be less than 10 bit data, from the analog-digital converter 130 and may then store it in the memory device. Furthermore, the accumulator 160 may be configured to execute a digital additively-accumulating operation on the memory device, and the accumulating operation may be repeated on a plurality of unit digital signals to generate an image signal containing data of 10 bits or more. For example, in the case where the unit digital signal is a digital signal of 6 bits and the image signal is data of 10 bits, the image signal may be generated by executing the additively-accumulating operation with 24 (i.e., 16) unit digital signals.

The output buffer 140 may be configured to latch and output the image data, which is provided by the accumulator 160. Under control of the timing controller 150, the output buffer 140 may store temporarily the image data output from the analog-digital converter 130 and may then output image data, which are sequentially latched by a column decode.

The timing controller 150 may control the pixel array 110, the row decoder 120, analog-digital converter (ADC) 130, the output buffer 140, the accumulator 160, and so forth. The timing controller 150 may supply control signals (e.g., clock signals and timing control signals) to the pixel array 110, the row decoder 120, analog-digital converter ADC, 130, the output buffer 140, and the accumulator 160, during the operation of the image sensor 100. The timing controller 150 may include a logic control circuit, a phase lock loop (PLL) circuit, a timing control circuit, a communication interface circuit, and so forth.

[Stacking Structure of Image Sensor]

Figure 12:
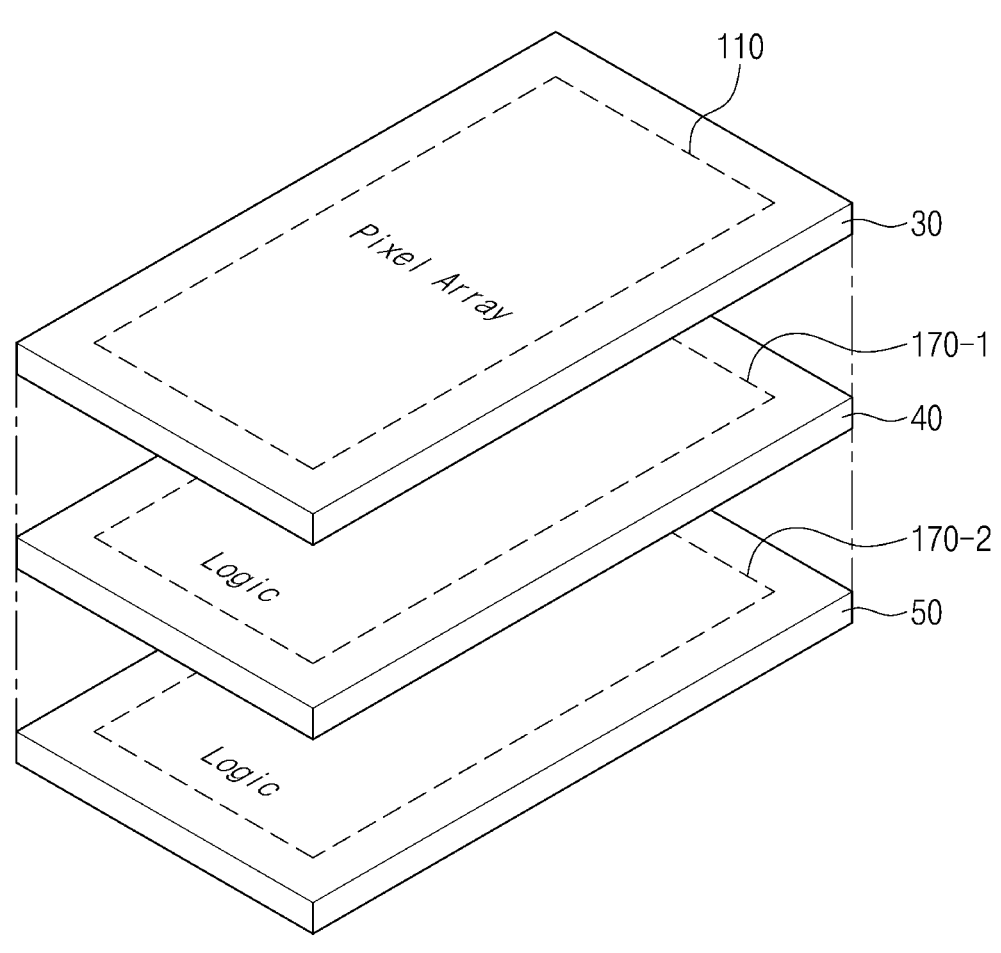
FIG. 12 is a three-dimensional diagram illustrating an image sensor according to an embodiment.

FIG. 12 is a diagram schematically illustrating a stacking structure of an image sensor according to an embodiment.

Referring to FIG. 12, an image sensor according to an embodiment may include a first layer 30, a second layer 40, and a third layer 50. The first layer 30 may be disposed on the second layer 40, and the second layer 40 may be disposed on the third layer 50. In this regard, the second layer 40 may be disposed between the first layer 30 and the third layer 50. The first layer 30 may include the pixel array 110, which is provided in a semiconductor substrate, and the second layer 40 may include a first logic region 170-1. The third layer 50 may include a second logic region 170-2.

The image sensor may be a 3 stack image sensor including three layers (e.g., 30, 40, and 50).

The first logic region 170-1 may include the analog-digital converter 130 of FIG. 11. The analog-digital converter 130 may be disposed in an array shape in the first logic region 170-1, which is vertically overlapped with the pixel array 110 of the first layer 30. Each analog-digital converter 130 may be electrically connected to a corresponding one of pixels, and in an embodiment, each analog-digital converter 130 may be electrically connected to one cluster composed of a plurality of pixels that are arranged in an N×M matrix shape, where each of N and M is a natural number that is equal to or greater than two.

The second logic region 170-2 may be configured to perform an image signal processing for changing the image data of FIG. 11 to data of a display-suitable type and/or for obtaining data for better image quality from the image data of FIG. 11.

The accumulator 160 may be placed in the first logic region 170-1 or the second logic region 170-2. In the case where the accumulator 160 is placed in the first logic region 170-1, it may be possible to secure a space, which will be used to dispose an image signal processing circuit, in the second logic region 170-2 of the third layer 50. This may make it possible to realize complex or various image signal processing operations. In the case where the accumulator 160 is placed in the second logic region 170-2, it may be possible to secure a space, which will be used to dispose the analog-digital converter 130, in the first logic region 170-1 of the second layer 40. Thus, it may be possible to connect one analog-digital converter to a corresponding one of clusters composed of less pixels. As a result, it may be possible to realize a high-speed operation of an image sensor.

In an image sensor according to an embodiment, a pixel may be provided to include a vertical transfer gate (VTG) and a floating diffusion region (FD), which are spatially spaced apart from each other, and this may make it possible to reduce a parasitic capacitance between the vertical transfer gate and the floating diffusion region and thereby to realize a high conversion gain (HCG). Accordingly, even when a change ($\Delta Qfd$) of an electric charge quantity in the floating diffusion region is small, an image signal sensing operation can be performed in a precise manner. That is, when viewed in light of a noise, it may be possible to improve a random noise (RN) which randomly occurs on a screen regardless of a position of a pixel.

In some example embodiments, each of the components represented by a block, such as those illustrated in FIG. 11, may be implemented as various numbers of hardware, software and/or firmware structures that execute respective functions described above, according to example embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of embodiments have been particularly shown and described, it will be understood by one of ordinary skill in the art that variations in form and detail may be made therein without departing from the spirit and scope of the attached claims.

What is claimed is:

1. An image sensor, comprising:
a semiconductor substrate comprising a first surface and a second surface, which are opposite to each other;
a photoelectric conversion region in the semiconductor substrate;
a vertical transfer gate, which extends into the semiconductor substrate from the first surface toward the photoelectric conversion region;
a floating diffusion region, which is provided in the semiconductor substrate, is spaced apart from the vertical transfer gate, and is an n-type impurity region;
a second impurity region, which is provided between the vertical transfer gate and the floating diffusion region and is a p-type impurity region;
a first contact metal on the vertical transfer gate; and
a second contact metal on the floating diffusion region,
wherein a distance along a horizontal direction from an edge of an upper portion of the vertical transfer gate to a center axis of the second contact metal is greater than ½ of a distance along the horizontal direction from a center axis of a lower portion of the vertical transfer gate to the edge of the upper portion of the vertical transfer gate.

2. The image sensor of claim 1, further comprising a third impurity region between the second impurity region and the floating diffusion region, wherein a p-type impurity concentration of the third impurity region is lower than a p-type impurity concentration of the second impurity region, and
wherein a width of the second impurity region is greater than a width of the third impurity region.

3. The image sensor of claim 1, further comprising:
deep trench isolations, which extend in parallel and define a pixel region,
wherein a distance from a center axis of the first contact metal to the center axis of the second contact metal is greater than ⅓ of a pixel length that is a distance between the deep trench isolations.

4. The image sensor of claim 1, further comprising a first impurity region, which is provided between the photoelectric conversion region and the second impurity region, and is adjacent to the vertical transfer gate,
wherein a p-type impurity concentration of the first impurity region is higher than a p-type impurity concentration of the second impurity region, and
wherein a height of the second impurity region is higher than a height of the first impurity region.

5. The image sensor of claim 1, wherein, in a single pixel region, the lower portion of the vertical transfer gate comprises a plurality of gate structures.

6. The image sensor of claim 5, further comprising deep trench isolations, which extend in parallel and delimit pixel regions,
wherein a distance between two of the plurality of gate structures is shorter than ⅕ of a pixel length, which is a distance between the deep trench isolations.

7. The image sensor of claim 1, wherein the vertical transfer gate has an L shape in a plan view.

8. The image sensor of claim 1, wherein the vertical transfer gate has a ring shape in a plan view, and
wherein the floating diffusion region is enclosed by the ring-shaped vertical transfer gate.

* * * * *